(12) United States Patent
Ishizu

(10) Patent No.: US 9,059,018 B2
(45) Date of Patent: Jun. 16, 2015

(54) SEMICONDUCTOR DEVICE LAYOUT REDUCING IMBALANCE IN CHARACTERISTICS OF PAIRED TRANSISTORS

(71) Applicant: PANASONIC CORPORATION, Osaka (JP)

(72) Inventor: Tomoyuki Ishizu, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 14/048,885

(22) Filed: Oct. 8, 2013

(65) Prior Publication Data

US 2014/0077306 A1 Mar. 20, 2014

Related U.S. Application Data

(60) Division of application No. 13/034,160, filed on Feb. 24, 2011, now Pat. No. 8,575,703, which is a continuation of application No. PCT/JP2009/002600, filed on Jun. 9, 2009.

(30) Foreign Application Priority Data

Nov. 18, 2008 (JP) ................. 2008-294818

(51) Int. Cl.
*H01L 21/70* (2006.01)
*H01L 27/088* (2006.01)
(Continued)

(52) U.S. Cl.
CPC ........... *H01L 27/088* (2013.01); *H01L 29/6659* (2013.01); *H01L 27/1104* (2013.01);
(Continued)

(58) Field of Classification Search
CPC . H01L 27/0207; H01L 27/088; H01L 27/092; H01L 27/11; H01L 27/1104; H01L 21/823807; H01L 29/6659
USPC ........... 257/368, 202, 206, 401; 438/128–129
See application file for complete search history.

(56) References Cited

U.S. PATENT DOCUMENTS

| 3,863,331 A | 2/1975 | Schade, Jr. |
| 5,389,810 A | 2/1995 | Agata et al. |

(Continued)

FOREIGN PATENT DOCUMENTS

| JP | 11-234109 A | 8/1999 |
| JP | 2001-332706 A | 11/2001 |

(Continued)

OTHER PUBLICATIONS

A. Oishi et al., "High Performance CMOSFET Technology for 45nm Generation and Scalability of Stress-Induced Mobility Enhancement Technique," IEDM digest, 2005, pp. 239.

(Continued)

*Primary Examiner* — Mohammed Shamsuzzaman
(74) *Attorney, Agent, or Firm* — McDermott Will & Emery LLP

(57) ABSTRACT

In a semiconductor device having paired transistors, an imbalance in characteristics of the paired transistors is reduced or prevented while an increase in circuit area is reduced or prevented. First and second transistors have first and second regions having the same active region pattern, and third and fourth transistors have third and fourth regions having the same active region pattern. The active regions of the third and fourth transistors have a longer length in the channel length direction than that of the active regions of the first and second transistors. The third and fourth regions have a narrower width in the channel length direction than that of the first and second regions.

11 Claims, 21 Drawing Sheets

(51) Int. Cl.
*H01L 27/11* (2006.01)
*H01L 27/02* (2006.01)
*H01L 27/092* (2006.01)
*H01L 29/66* (2006.01)
*H01L 21/8238* (2006.01)

(52) U.S. Cl.
CPC ......... *H01L21/823807* (2013.01); *H01L 27/11* (2013.01); *H01L 27/0207* (2013.01); *H01L 27/092* (2013.01)

(56) References Cited

U.S. PATENT DOCUMENTS

| | | | |
|---|---|---|---|
| 5,457,064 | A | 10/1995 | Lee |
| 5,498,579 | A | 3/1996 | Borodovsky et al. |
| RE36,440 | E | 12/1999 | Lee et al. |
| 6,342,408 | B1 | 1/2002 | Oowaki et al. |
| 6,394,638 | B1 | 5/2002 | Sengle et al. |
| 6,469,316 | B1 | 10/2002 | Bush et al. |
| 6,476,424 | B1 | 11/2002 | Ishida |
| 6,635,935 | B2 * | 10/2003 | Makino ............ 257/369 |
| 6,639,274 | B2 | 10/2003 | Fujishima |
| 7,064,453 | B2 * | 6/2006 | Sato ............ 257/202 |
| 7,087,493 | B1 | 8/2006 | Madan |
| 7,205,617 | B2 * | 4/2007 | Ohta et al. ............ 257/374 |
| 7,228,510 | B2 | 6/2007 | Ono |
| 7,408,226 | B2 | 8/2008 | Takizawa |
| 7,538,384 | B2 | 5/2009 | Lee |
| 7,562,327 | B2 | 7/2009 | Sekido et al. |
| 7,582,494 | B2 | 9/2009 | Chung et al. |
| 7,692,226 | B2 | 4/2010 | Lee |
| 7,808,051 | B2 | 10/2010 | Hou et al. |
| 7,812,453 | B2 * | 10/2010 | Kiyota ............ 257/758 |
| 8,053,346 | B2 | 11/2011 | Ryu et al. |
| 8,183,639 | B2 | 5/2012 | Malinge et al. |
| 8,198,655 | B1 | 6/2012 | Pileggi et al. |
| 2003/0132473 | A1 | 7/2003 | Kumagai et al. |
| 2004/0044511 | A1 | 3/2004 | Sekido et al. |
| 2005/0040435 | A1 | 2/2005 | Ono |
| 2005/0124095 | A1 | 6/2005 | Liaw |
| 2005/0189595 | A1 * | 9/2005 | Okamoto et al. ............ 257/368 |
| 2006/0077737 | A1 | 4/2006 | Ooishi |
| 2006/0145266 | A1 | 7/2006 | Zushi et al. |
| 2006/0186478 | A1 | 8/2006 | Hughes et al. |
| 2006/0244013 | A1 | 11/2006 | Matsunaga et al. |
| 2007/0096323 | A1 | 5/2007 | Thompson et al. |
| 2007/0164317 | A1 * | 7/2007 | Nakanishi ............ 257/206 |
| 2008/0013358 | A1 | 1/2008 | Ooishi |
| 2008/0022247 | A1 | 1/2008 | Kojima et al. |
| 2008/0142898 | A1 | 6/2008 | Watanabe et al. |
| 2008/0210981 | A1 * | 9/2008 | Chang et al. ............ 257/206 |
| 2008/0251833 | A1 | 10/2008 | Specht et al. |
| 2008/0258236 | A1 | 10/2008 | Yasuoka et al. |
| 2009/0075432 | A1 | 3/2009 | Nii |
| 2009/0085067 | A1 * | 4/2009 | Hayashi et al. ............ 257/202 |
| 2009/0101940 | A1 | 4/2009 | Barrows et al. |
| 2009/0173971 | A1 | 7/2009 | Houston et al. |
| 2009/0212793 | A1 | 8/2009 | Guldi et al. |
| 2010/0078725 | A1 * | 4/2010 | Hou et al. ............ 257/368 |
| 2010/0216284 | A1 | 8/2010 | Nii |
| 2011/0075470 | A1 | 3/2011 | Liaw |
| 2011/0101462 | A1 * | 5/2011 | Torii ............ 257/368 |
| 2011/0171790 | A1 | 7/2011 | Chang et al. |
| 2011/0177658 | A1 | 7/2011 | Law et al. |
| 2011/0317466 | A1 | 12/2011 | Fastow et al. |
| 2012/0007187 | A1 * | 1/2012 | Ryu et al. ............ 257/368 |
| 2012/0086082 | A1 | 4/2012 | Malinge et al. |
| 2012/0091531 | A1 * | 4/2012 | Baldwin et al. ............ 257/368 |

FOREIGN PATENT DOCUMENTS

| | | |
|---|---|---|
| JP | 2003-158205 A | 5/2003 |
| JP | 2005-243928 A | 9/2005 |
| JP | 2006-190727 A | 7/2006 |
| JP | 2007-221095 A | 8/2007 |
| JP | 2008-004796 A | 1/2008 |
| JP | 2008-153435 A | 7/2008 |

OTHER PUBLICATIONS

G. Scott et al., "NMOS Drive Current Reduction Caused by Transistor Layout and Trench Isolation Induced Stress," IEDM digest, pp. 91, 1999.

Non-Final Office Action issued in U.S. Appl. No. 13/034,160 with date mailed Aug. 31, 2012.

Notice of Allowance issued in U.S. Appl. No. 13/034,160 with date mailed Mar. 13, 2013.

Notice of Allowance issued in U.S Appl. No. 13/034,160 with date mailed Jul. 8, 2013.

* cited by examiner

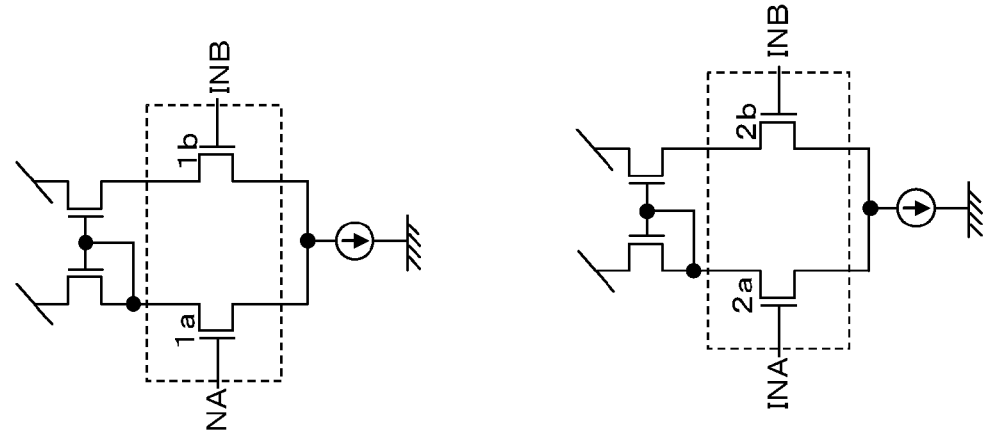
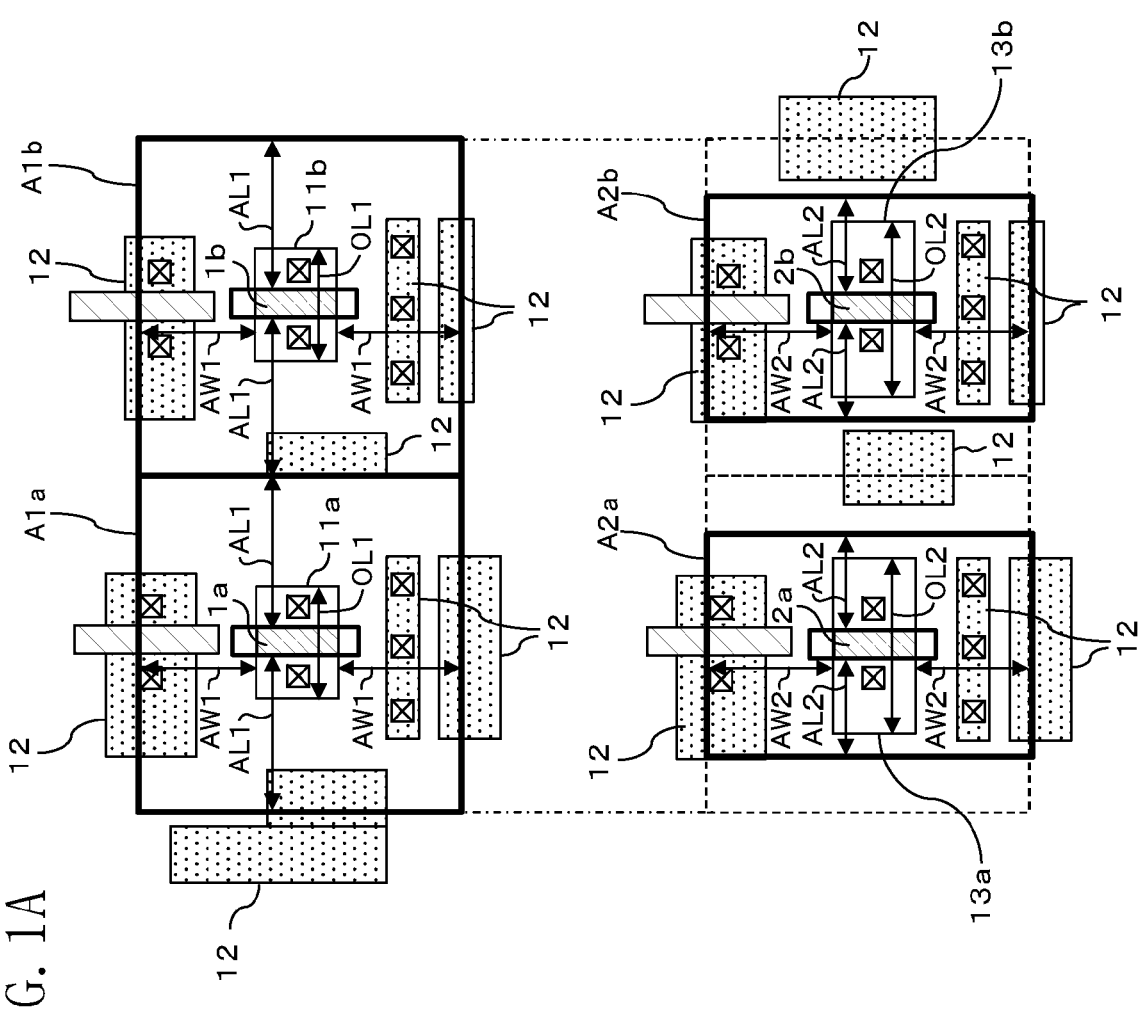
FIG. 1B
FIG. 1A

S SOURCE
D DRAIN

SEMICONDUCTOR DEVICE LAYOUT REDUCING IMBALANCE IN CHARACTERISTICS OF PAIRED TRANSISTORS

CROSS-REFERENCE TO RELATED APPLICATIONS

This application is a divisional application of U.S. patent application Ser. No. 13/034,160 filed on Feb. 24, 2011, which is a continuation of PCT International Application PCT/JP2009/002600 filed on Jun. 9, 2009, which claims priority to Japanese Patent Application No. 2008-294818 filed on Nov. 18, 2008. The disclosures of these applications including the specifications, the drawings, and the claims are hereby incorporated by reference in their entirety.

BACKGROUND

The present disclosure relates to semiconductor devices used in semiconductor integrated circuits, and more particularly, to techniques of improving characteristics of paired transistors included in a differential circuit etc.

A semiconductor integrated circuit device includes a large number of paired transistors forming a differential amplifier circuit, a current mirror circuit, etc. The difference in characteristics between the paired transistors has an influence on the performance, yield, etc. of the circuit.

In particular, when an isolation technique, such as shallow trench isolation (STI) etc., is used to fabricate a transistor, the channel mobility or the threshold voltage of the transistor varies depending on STI-induced mechanical stress applied on the active region of the transistor. Therefore, it is known that when paired transistors have active regions having different shapes, the difference in characteristics between the paired transistors is significant (see, for example, "NMOS Drive Current Reduction Caused by Transistor Layout and Trench Isolation Induced Stress," G. Scott, et. al., IEDM digest, pp. 91, 1999).

When gate electrodes are formed by a lithography process or an etching process, a dimension of a gate electrode may be altered by the layout pattern of its surrounding gate electrodes, leading to a difference in characteristics. In recent years, there has been a known technique of covering upper portions of the gate electrode and the active region with a highly strained film to improve the drive performance of a transistor. In this technique, however, the influence of stress may vary depending on the gate electrodes of paired transistors or the layout pattern of their surrounding gate electrodes, leading to a difference in characteristics (see "High Performance CMOSFET Technology for 45 nm Generation and Scalability of Stress-Induced Mobility Enhancement Technique," A. Oishi, et. al., IEDM digest, pp. 239, 2005).

In conventional semiconductor devices, in order to reduce the difference in characteristics between paired transistors, the paired transistors may be located at perfectly symmetric positions to reduce a difference in characteristics which is caused by a difference in layout pattern, for example.

For example, as shown in FIG. 21, paired transistors 100a and 100b are provided with dummy elements 102a and 102b having the same shape as that of a transistor 101 adjacent to the transistors 100a and 100b in the channel length direction being provided on opposite sides of the transistors 100a and 100b. Similarly, dummy elements 104a and 104b having the same shape as that of a transistor 103 adjacent to the transistor 100a are provided at the same distance from the transistors 100a and 100b in the channel width direction, respectively.

By thus providing the same surrounding layout to the paired transistors, the imbalance in characteristics between the paired transistors is reduced or prevented (see Japanese Patent Publication No. H11-234109).

SUMMARY

In the above techniques, however, the same layout pattern of dummy elements need to be provided around paired transistors of interest, which is likely to lead to an increase in circuit area. Moreover, although only the shapes of the closest elements are taken into consideration in the above techniques, farther elements separated from the paired transistors of interest by isolation regions may also be responsible for the imbalance in characteristics between the paired transistors of interest.

The present disclosure describes implementations of a semiconductor device including paired transistors in which the imbalance in characteristics between the paired transistors can be reduced or prevented while the increase in circuit area is reduced or prevented.

A semiconductor device according to a first aspect of the present disclosure includes a first and a second transistor having the same channel length and channel width and used as paired transistors, and a third and a fourth transistor having the same channel length and channel width and used as paired transistors. The first and second transistors have a first and a second same-active-region region, respectively, each having an active region pattern including an active region of the transistor and one or more surrounding active regions formed around the active region and separated from the active region by an isolation region, where the active region patterns of the first and second same-active-region regions are the same. The third and fourth transistors have a third and a fourth same-active-region region, respectively, each having an active region pattern including an active region of the transistor and one or more surrounding active regions formed around the active region and separated from the active region by an isolation region, where the active region patterns of the third and fourth same-active-region regions are the same. The active regions of the third and fourth transistors have a longer length in a channel length direction than that of the active regions of the first and second transistors. The third and fourth same-active-region regions have a narrower width in the channel length direction than that of the first and second same-active-region regions.

According to the semiconductor device of the first aspect of the present disclosure, the first and second transistors have the first and second same-active-region regions having the same active region pattern. Therefore, the first and second transistors have the same mechanical stress applied on the respective channel regions, whereby the imbalance in transistor characteristics caused by the layout patterns of the active regions and their surrounding active regions can be reduced or prevented. Similarly, in the third and fourth transistors, the imbalance in transistor characteristics caused by the layout patterns of the active regions and their surrounding active regions can be reduced or prevented. Moreover, the length in the channel length direction of the active regions of the third and fourth transistors is longer than that of the active regions of the first and second transistor, and the width in the channel length direction of the third and fourth same-active-region regions is narrower than that of the first and second same-active-region regions. This feature is provided by taking into consideration an isolation distance in the channel length direction beyond which stress applied on the channel region is saturated. As a result, a region where a layout pattern is limited is narrowed, whereby a region where a layout can be flexibly designed can be increased. Also, in a region outside the same-active-region region, it is not necessary to provide a dummy element etc., whereby the increase in circuit area can be reduced or prevented. Thus, the imbalance in transistor characteristics caused by a layout pattern can be reduced or prevented while the increase in circuit area is reduced or prevented.

A semiconductor device according to a second aspect of the present disclosure includes a first and a second transistor having the same channel length and channel width and used as paired transistors, and a third and a fourth transistor having the same channel length and channel width and used as paired transistors. The first and second transistors have a first and a second same-active-region region, respectively, each having an active region pattern including an active region of the transistor and one or more surrounding active regions formed around the active region and separated from the active region by an isolation region, where the active region patterns of the first and second same-active-region regions are the same. The third and fourth transistors have a third and a fourth same-active-region region, respectively, each having an active region pattern including an active region of the transistor and one or more surrounding active regions formed around the active region and separated from the active region by an isolation region, where the active region patterns of the third and fourth same-active-region regions are the same. The active regions of the third and fourth transistors have a longer length in a channel width direction than that of the active regions of the first and second transistors. The third and fourth same-active-region regions have a narrower width in the channel width direction than that of the first and second same-active-region regions.

According to the semiconductor device of the second aspect of the present disclosure, the first and second transistors have the first and second same-active-region regions having the same active region pattern. Therefore, the first and second transistors have the same mechanical stress applied on the respective channel regions, whereby the imbalance in transistor characteristics caused by the layout patterns of the active regions and their surrounding active regions can be reduced or prevented. Similarly, in the third and fourth transistors, the imbalance in transistor characteristics caused by the layout patterns of the active regions and their surrounding active regions can be reduced or prevented. Moreover, the length in the channel width direction of the active regions of the third and fourth transistors is longer than that of the active regions of the first and second transistor, and the width in the channel width direction of the third and fourth same-active-region regions is narrower than that of the first and second same-active-region regions. This feature is provided by taking into consideration an isolation distance in the channel width direction beyond which stress applied on the channel region is saturated. As a result, a region where a layout pattern is limited is narrowed, whereby a region where a layout can be flexibly designed can be increased. Also, in a region outside the same-active-region region, it is not necessary to provide a dummy element etc., whereby the increase in circuit area can be reduced or prevented. Thus, the imbalance in transistor characteristics caused by a layout pattern can be reduced or prevented while the increase in circuit area is reduced or prevented.

In the first and second aspects, at least one of the one or more surrounding active regions may be a part of a dummy element, or alternatively, a part of an active element.

As a result, any one of a dummy active region and an active region can be selected as a surrounding active region, whereby the flexibility of design can be improved, and the imbalance in transistor characteristics caused by a layout pattern can be reduced or prevented while the increase in circuit area can be reduced or prevented.

A semiconductor device according to a third aspect of the present disclosure includes a first and a second transistor having the same channel length and channel width and used as paired transistors, and a third and a fourth transistor having the same channel length and channel width and used as paired transistors. The first and second transistors have a first and a second same-gate-electrode region, respectively, each having a gate electrode pattern including a gate electrode of the transistor and one or more surrounding gate electrodes formed around the gate electrode, where the gate electrode patterns of the first and second same-gate-electrode regions are the same. The third and fourth transistors have a third and a fourth same-gate-electrode region, respectively, each having a gate electrode pattern including a gate electrode of the transistor and one or more surrounding gate electrodes formed around the gate electrode, where the gate electrode patterns of the third and fourth same-gate-electrode regions are the same. The third and fourth transistors have a longer channel length than that of the first and second transistors. The third and fourth same-gate-electrode regions have a narrower width in a channel length direction than that of the first and second same-gate-electrode regions.

According to the semiconductor device of the third of the present disclosure, the first and second transistors have the first and second same-gate-electrode regions having the same gate electrode pattern. Therefore, the first and second transistors have the same gate electrode dimension, and the same mechanical stress applied on the respective channel regions, whereby the imbalance in transistor characteristics caused by the layout patterns of the gate electrodes can be reduced or prevented. Similarly, in the third and fourth transistors, the imbalance in transistor characteristics caused by the layout patterns of the gate electrodes can be reduced or prevented. Moreover, the channel length of the third and fourth transistors is longer than that of the first and second transistors, and the width in the channel length direction of the third and fourth same-gate-electrode regions is narrower than that of the first and second same-gate-electrode regions. This feature is provided by taking into consideration a gate-to-gate distance beyond which stress applied on the channel region is saturated. As a result, a region where a layout pattern is limited is narrowed, whereby a region where a layout can be flexibly designed can be increased. Also, in a region outside the same-gate-electrode region, it is not necessary to provide a dummy gate electrode etc., whereby the increase in circuit area can be reduced or prevented. Thus, the imbalance in transistor characteristics caused by a layout pattern can be reduced or prevented while the increase in circuit area is reduced or prevented.

In the third aspect, at least one of the one or more surrounding gate electrodes may be a dummy gate electrode, or alternatively, an active gate electrode.

As a result, any one of a dummy gate electrode and an active gate electrode can be selected as a surrounding gate electrode, whereby the flexibility of design can be improved, and the imbalance in transistor characteristics caused by a layout pattern can be reduced or prevented while the increase in circuit area can be reduced or prevented.

A semiconductor device according to a fourth aspect of the present disclosure includes a first and a second transistor having the same channel length and channel width and used as paired transistors, and a third and a fourth transistor having the same channel length and channel width and used as paired transistors. The first and second transistors have a first and a second same-active-region region, respectively, each having an active region pattern including an active region of the transistor and one or more surrounding active regions formed around the active region and separated from the active region by an isolation region, where the active region patterns of the first and second same-active-region regions are the same, and a first and a second same-gate-electrode region, respectively, each having a gate electrode pattern including a gate electrode of the transistor and one or more surrounding gate electrodes formed around the gate electrode, where the gate electrode patterns of the first and second same-gate-electrode regions are the same. The third and fourth transistors have a third and a fourth same-active-region region, respectively, each having an active region pattern including an active region of the transistor and one or more surrounding active regions formed around the active region and separated from the active region by an isolation region, where the active region patterns of the third and fourth same-active-region regions are the same, and a third and a fourth same-gate-electrode region, respectively, each having a gate electrode pattern including a gate electrode of the transistor and one or more surrounding gate electrodes formed around the gate electrode, where the gate electrode patterns of the third and fourth same-gate-electrode regions are the same. The first and second same-active-region regions and the first and second same-gate-electrode regions have different sizes. The third and fourth same-active-region regions and the third and fourth same-gate-electrode regions have different sizes.

According to the semiconductor device of the fourth aspect of the present disclosure, the first and second transistors have the first and second same-active-region region having the same active region pattern, and the first and second same-gate-electrode regions having the same gate electrode pattern. The third and fourth transistors have the third and fourth same-active-region regions having the same active region pattern, and the third and fourth same-gate-electrode regions having the same gate electrode pattern. As a result, both the imbalance in transistor characteristics caused by the layout patterns of the active regions and their surrounding active regions and the imbalance in transistor characteristics caused by the layout patterns of the gate electrodes can be reduced or prevented. The first and second same-active-region regions and the first and second same-gate-electrode regions have different sizes, and the third and fourth same-active-region regions and the third and fourth same-gate-electrode regions have different sizes. As a result, for example, even when there is a difference in sensitivity between fluctuations in transistor characteristics caused by the active region patterns and fluctuations in transistor characteristics caused by the gate electrode patterns, the same-active-region regions and the same-gate-electrode regions can be set independently and separately, and therefore, it is possible to reduce or avoid excessive limitation of a layout pattern. Therefore, the flexibility of design can be improved, and the imbalance in transistor characteristics caused by a layout pattern can be reduced or prevented while the increase in circuit area can be reduced or prevented.

In the first to fourth aspects, the first and second transistors may have the same current direction, as viewed with respect to the semiconductor device, and the third and fourth transistors may have the same current direction, as viewed with respect to the semiconductor device.

As a result, the imbalance in transistor characteristics caused by asymmetric implanted impurity distributions in the channel region in the vicinity of a source and a drain can be reduced or prevented.

In the first, second, or fourth aspect, the first and second transistors may have the same current direction, as viewed with respect to the active region patterns of the first and second same-active-region regions, and the third and fourth transistors may have the same current direction, as viewed with respect to the active region patterns of the third and fourth same-active-region regions.

As a result, the imbalance in transistor characteristics caused by asymmetric implanted impurity distributions caused by mechanical stresses in the channel region in the vicinity of a source and a drain can be reduced or prevented.

The semiconductor device may further include a fifth and a sixth transistor having the same channel length and channel width. The fifth and sixth transistors may have fifth and sixth same-active-region regions, respectively, which have the same active region pattern as that of the first and second same-active-region regions, and the same current direction, as viewed with respect to the active region patterns of the fifth and sixth same-active-region regions. The first and second transistors may have opposite current directions, as viewed with respect to the semiconductor device. The fifth and first transistors may have opposite current directions, and a gate, drain, and source of the fifth transistor may be connected to a gate, drain, and source of the first transistor, respectively. The sixth and second transistors may have opposite current directions, and a gate, drain, and source of the sixth transistor may be connected to a gate, drain, and source of the second transistor, respectively.

As a result, the imbalance in transistor characteristics caused by asymmetric impurity distributions caused by implantation can be canceled by the fifth and sixth transistors, and the imbalance in transistor characteristics caused by a layout pattern can be reduced or prevented, and at the same time, the flexibility of design can be improved.

According to the present disclosure, by providing same-active-region regions or same-gate-electrode regions for paired transistors forming a differential circuit etc., a mismatch between the influences of mechanical stresses caused by a layout pattern is reduced or prevented, whereby the imbalance in transistor characteristics can be reduced or prevented. Also, by setting a size of the same-active-region regions or the same-gate-electrode regions based on the active region length or the channel length of transistors, or setting the same-active-region regions and the same-gate-electrode regions independently and separately, the flexibility of design can be improved, and the increase in circuit area can be reduced or prevented. Therefore, a semiconductor device which has circuit characteristics close to a desired design goal can be obtained while the increase in area can be reduced or prevented.

BRIEF DESCRIPTION OF THE DRAWINGS

FIG. 1A is a plan view showing an example structure of a semiconductor device according to a first embodiment of the present disclosure.

FIG. 1B is a circuit diagram showing a differential circuit including transistors shown in FIG. 1A.

DETAILED DESCRIPTION

Figure 2:
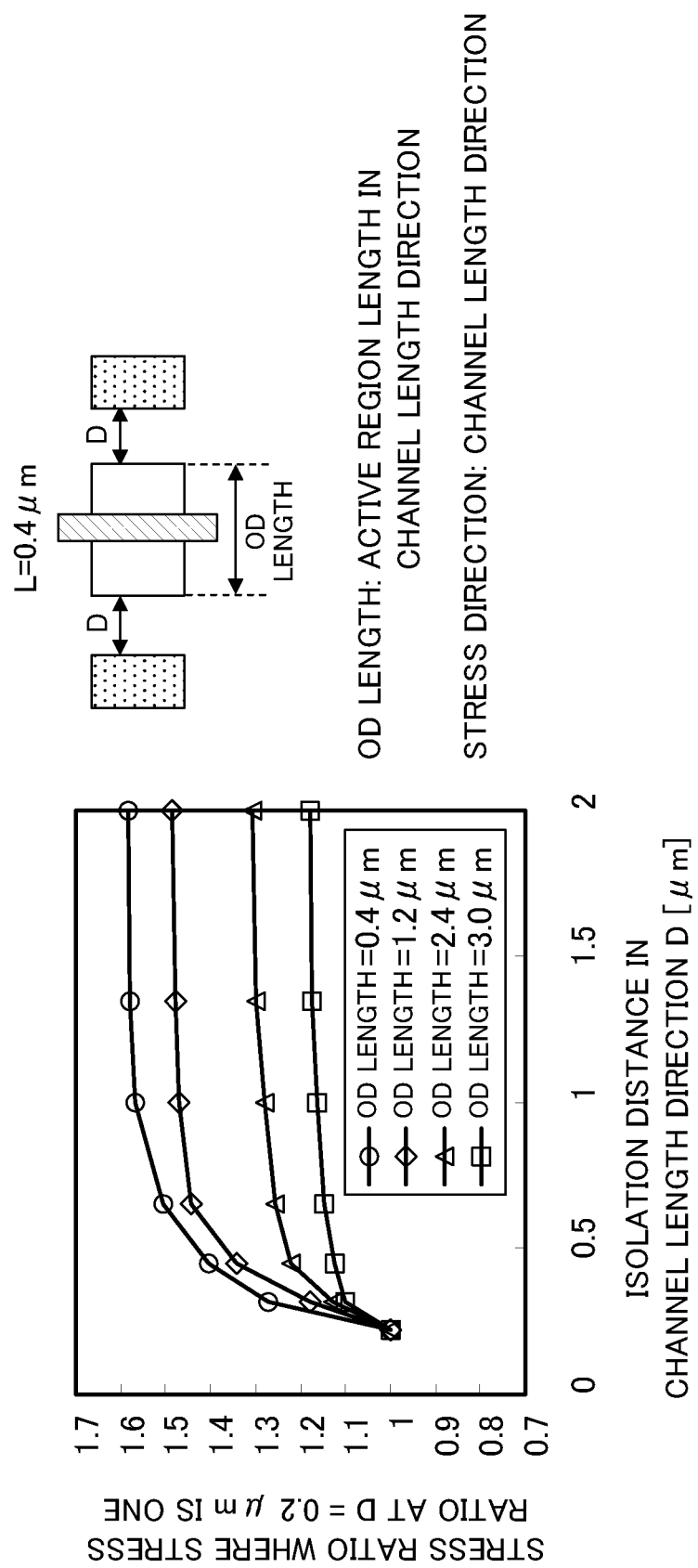
FIG. 2 is a diagram showing the result of a process simulation for demonstrating advantages of the semiconductor device of the first embodiment.

Embodiments of the present disclosure will be described hereinafter with reference to the accompanying drawings.

First Embodiment

FIG. 1A is a plan view showing an example structure of a semiconductor device according to a first embodiment of the present disclosure. As shown in FIG. 1A, the semiconductor device of this embodiment includes transistors (first and second transistors) $1a$ and $1b$ having the same channel length and channel width, and transistors (third and fourth transistors) $2a$ and $2b$ having the same channel length and channel width. Note that, as shown in a circuit diagram of FIG. 1B, the pairs of the transistors $1a$ and $1b$ and the transistors $2a$ and $2b$ are each used to form a differential circuit etc.

The transistors $1a$ and $1b$ include active regions $11a$ and $11b$ having the same size, respectively, and the transistors $2a$ and $2b$ have active regions $13a$ and $13b$ having the same size, respectively. In each transistor, a region where the active region and the gate electrode overlap is a channel region. The active regions $11a$ and $11b$ of the transistors $1a$ and $1b$ have a length OL1 in the channel length direction and the active regions $13a$ and $13b$ of the transistors $2a$ and $2b$ have a length OL2 in the channel length direction, where the length OL2 is longer than the length OL1.

For the transistors $1a$ and $1b$, regions (first and second same-active-region regions) A1$a$ and A1$b$ are defined, respectively. The region A1$a$ or A1$b$ has an active region pattern including the active region $11a$ or $11b$ and its surrounding active regions $12$ which are separated from the active region $11a$ or $11b$ by an isolation region. The active region patterns in the regions A1$a$ and A1$b$ are the same. Note that the active region pattern refers to a layout pattern of an active region and its surrounding active regions, and that the active region patterns are the same means that, in the corresponding regions, the corresponding active regions have the same shape and are located at the same corresponding positions, and the corresponding surrounding active regions have the same shape and are located at the same corresponding positions. The regions A1$a$ and A1$b$ extend over a distance AL1 in the channel length direction and a distance AW1 in the channel width direction, from the channel regions of the transistors $1a$ and $1b$. The shapes and positions of active regions other than the regions A1$a$ and A1$b$ may not necessarily be the same.

For the transistors $2a$ and $2b$, regions (third and fourth same-active-region regions) A2$a$ and A2$b$ are defined, respectively. The region A2$a$ or A2$b$ has an active region pattern including the active region $13a$ or $13b$ and its surrounding active regions $12$ which are separated from the active region $13a$ or $13b$ by an isolation region. The active region patterns in the regions A2$a$ and A2$b$ are the same. The regions A2$a$ and A2$b$ extend over a distance AL2 in the channel length direction and a distance AW2 in the channel width direction, from the channel regions of the transistors $2a$ and $2b$. The shapes and positions of active regions other than the regions A2$a$ and A2$b$ may not necessarily be the same.

As shown in FIG. 1A, the regions A2$a$ and A2$b$ have a width in the channel length direction which is smaller than that of the regions A1$a$ and A1$b$. That is, OL1<OL2 and AL1>AL2.

FIG. 2 shows the result of a process simulation of mechanical stress in the channel length direction which occurs in the channel region of a transistor. The stress was analyzed using a two-dimensional process simulator, and was calculated, taking into consideration the influence of thermal stress, in-film stress, and thermal oxidative stress. Average stress values of the channel region interface were calculated and plotted, where the channel length of the transistor was 0.4 μm, and the length in the channel length direction of the active region was 0.4 μm, 1.2 μm, 2.4 μm, or 3 μm. The horizontal axis indicates isolation distances D [μm] in the channel length direction, and the vertical axis indicates stress ratios where stress at D=0.2 μm is one. FIG. 2 shows the dependency of mechanical stress occurring in the channel region on the position of a surrounding active region.

As can be seen from FIG. 2, the stress applied to the channel region in the channel length direction increases with an increase in the isolation distance D in the channel length direction, and is saturated when the distance D exceeds a predetermined level. Therefore, it is considered that the influence on the stress of the shape or position of an active region provided in a region located at a predetermined distance or more from the channel region in the channel length direction, is substantially negligible.

Therefore, the distance from the channel region beyond which the transistor characteristics or the stress value is saturated is obtained based on the result of actual measurement of the dependency of the transistor characteristics on the shape of an active region, the result of stress analysis of a process simulation, etc., and is used to define the above same-active-region region. Thereafter, for two paired transistors, the shapes and positions of the corresponding active regions are caused to be the same in the same-active-region regions. As a result, the imbalance in transistor characteristics caused by the active region patterns can be reduced or prevented. Since all corresponding active regions in the same-active-region regions have the same shapes and positions, not only the influence of near surrounding active regions, but also the influence of farther surrounding active regions separated from the transistors of interest by isolation regions, can be reduced or prevented.

As can also be seen from FIG. 2, as the length in the channel length direction of the active region increases in a transistor, the isolation distance in the channel length direction of the transistor beyond which stress applied on the channel region is saturated decreases. Therefore, paired transistors having a longer active region length in the channel length direction may have a narrower width in the channel length direction of the same-active-region regions. In other words, the imbalance in transistor characteristics between paired transistors having a longer active region length in the channel length direction can be reduced or prevented by using narrower same-active-region regions.

As described above, in the semiconductor device of this embodiment, as shown in FIG. 1A, the active region length OL2 in the channel length direction of the transistors 2a and 2b is longer than the active region length OL1 in the channel length direction of the transistors 1a and 1b. Therefore, the same-active-region regions A2a and A2b of the transistors 2a and 2b have a narrower width in the channel length direction than that of the same-active-region regions A1a and A1b of the transistors 1a and 1b. As a result, the same-active-region regions A2a and A2b are narrower than the same-active-region regions A1a and A1b, and therefore, the range within which the layout pattern is limited is reduced, whereby the flexibility of arrangement of active regions can be increased proportionately, resulting in an increase in the flexibility of design.

Figure 3:
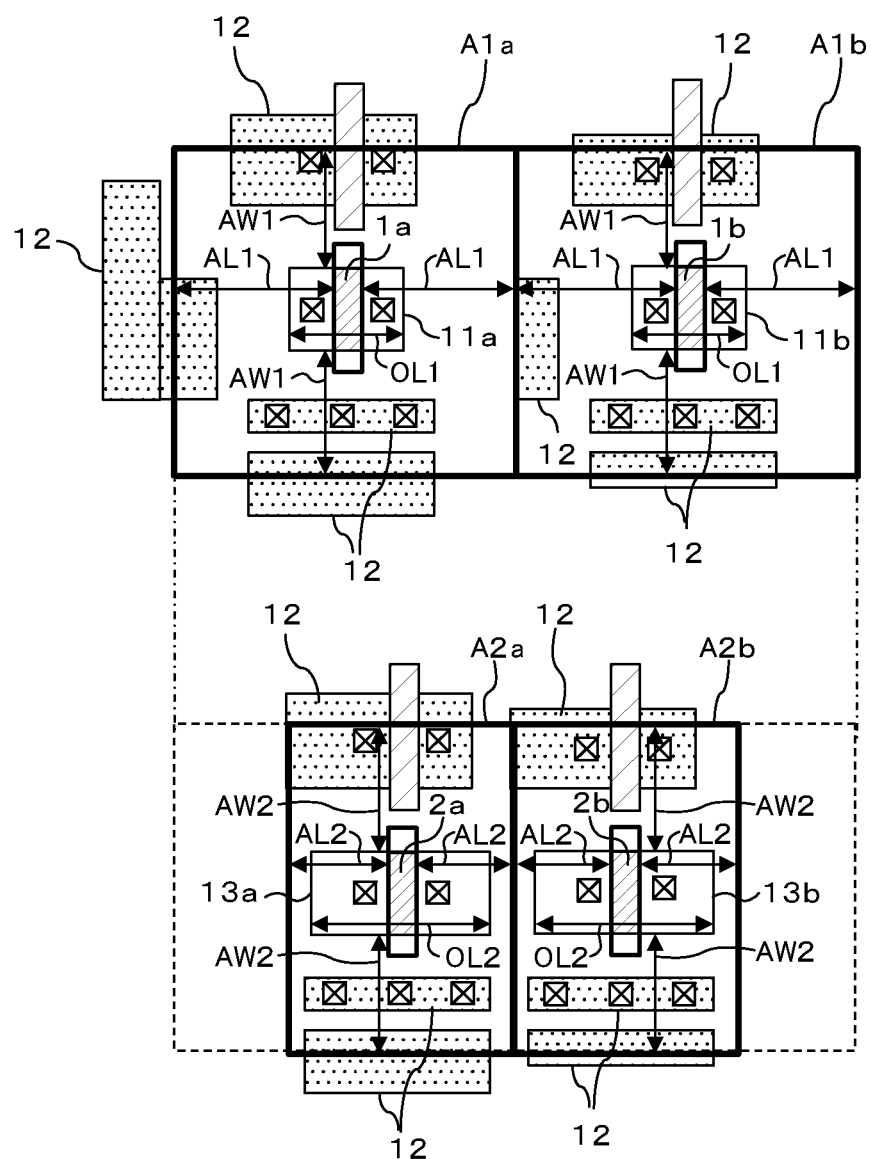
FIG. 3 is a plan view showing another example structure of the semiconductor device of the first embodiment.

FIG. 3 is a plan view showing another example structure of the semiconductor device of this embodiment. In the structure of FIG. 3, the same-active-region regions A2a and A2b of the transistors 2a and 2b are adjacent to and touch each other. As a result, the range within the layout pattern is limited becomes narrower and more compact, whereby the circuit area can be further reduced.

Figure 4:
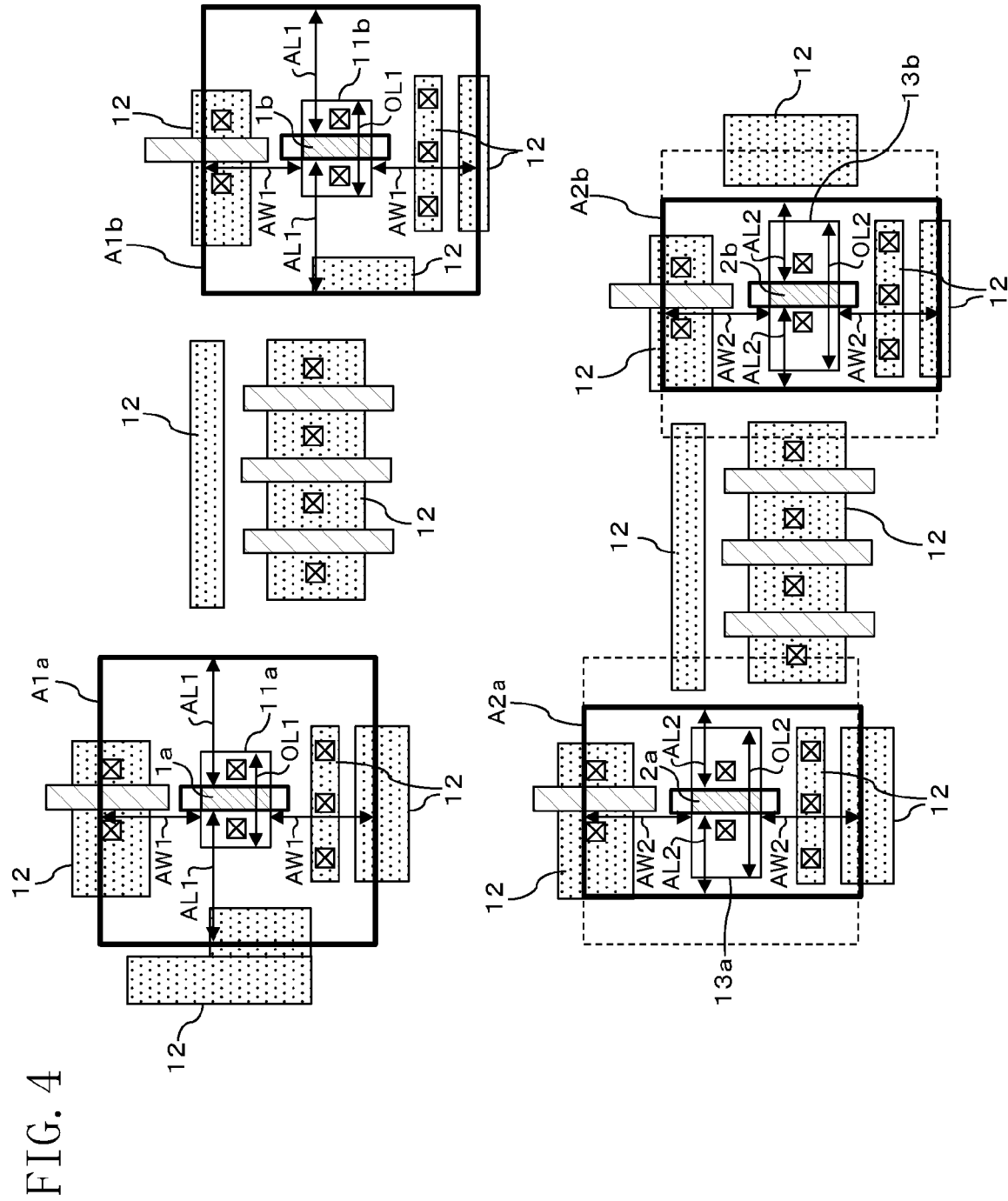
FIG. 4 is a plan view showing still another example structure of the semiconductor device of the first embodiment.

FIG. 4 is a plan view showing still another example structure of the semiconductor device of this embodiment. In the structure of FIG. 1, the transistors 1a and 1b are adjacent to each other, and the transistors 2a and 2b are also adjacent to each other. Note that paired transistors may not necessarily be adjacent to each other. Specifically, in the structure of FIG. 4, the transistors 1a and 1b are separated or arranged at a distance from each other, and the transistors 2a and 2b are also separated or arranged at a distance from each other.

Note that the surrounding active regions 12 in each of the same-active-region regions A1a, A1b, A2a, and A2b may be active regions which are electrically connected, i.e., active elements, or alternatively, may be dummy active regions which are not electrically connected, i.e., dummy elements. Because any one of a dummy active region and an active region can be selected, the imbalance in transistor characteristics can be reduced or prevented while the flexibility of design can be improved.

Second Embodiment

In the first embodiment, an example has been described in which two pairs of transistors have active regions having different lengths in the channel length direction. In a second embodiment, an example will be described in which two pairs of transistors have active regions having different lengths in the channel width direction.

Figure 5A:
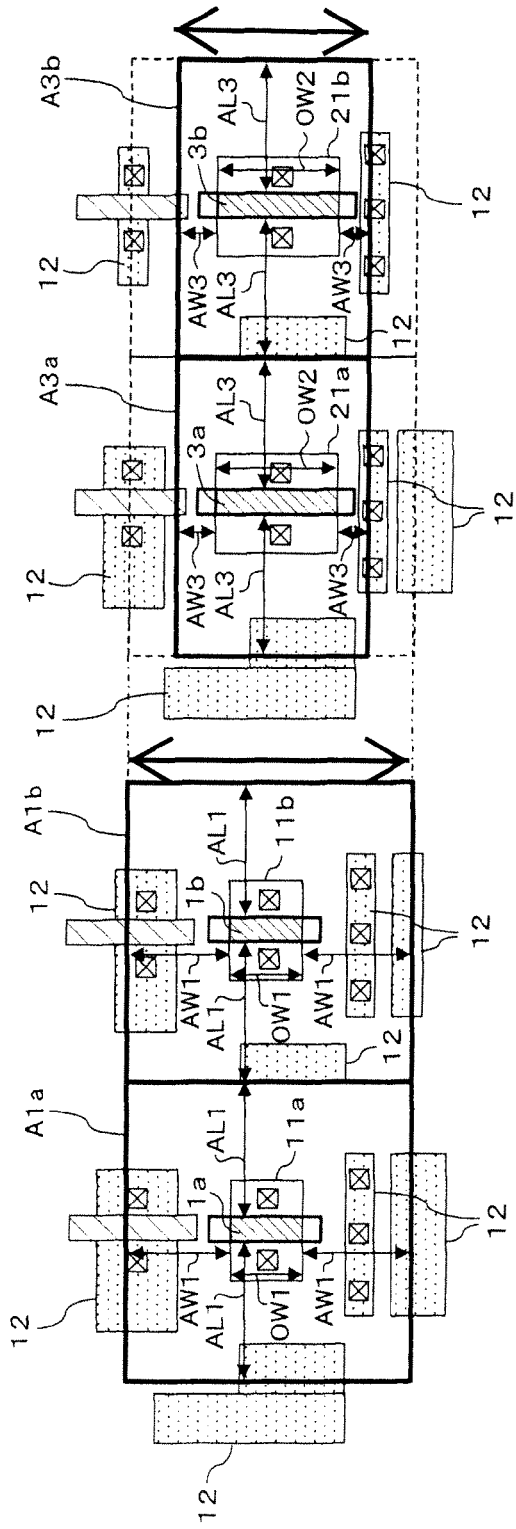
FIG. 5A is a plan view showing an example structure of a semiconductor device according to a second embodiment of the present disclosure.
Figure 5B:
FIG. 5B is a circuit diagram showing a differential circuit including transistors shown in FIG. 5A.

FIG. 5A is a plan view showing an example structure of a semiconductor device according to the second embodiment of the present disclosure. As shown in FIG. 5A, the semiconductor device of this embodiment includes transistors (first and second transistors) 1a and 1b having the same channel length and channel width, and transistors (third and fourth transistors) 3a and 3b having the same channel length and channel width. Note that, as shown in a circuit diagram of FIG. 5B, the pairs of the transistors 1a and 1b and the transistors 3a and 3b are each used to form a differential circuit etc.

The transistors 1a and 1b have active regions 11a and 11b having the same size, and the transistors 3a and 3b have active regions 21a and 21b having the same size. In each transistor, a region where the active region and the gate electrode overlap is a channel region. The active regions 11a and 11b of the transistors 1a and 1b have a length OW1 in the channel width direction and the active regions 21a and 21b of the transistors 3a and 3b have a length OW2 in the channel width direction, where the length OW2 is longer than the length OW1.

For the transistors 1a and 1b, regions (first and second same-active-region regions) A1a and A1b are defined, respectively. The region A1a or A1b has an active region pattern including the active region 11a or 11b and its surrounding active regions 12 which are separated from the active region 11a or 11b by an isolation region. The active region patterns in the regions A1a and A1b are the same. The regions A1a and A1b extend over a distance AL1 in the channel length direction and a distance AW1 in the channel width direction, from the channel regions of the transistors 1a and 1b. The shapes and positions of active regions other than the regions A1a and A1b may not necessarily be the same.

For the transistors 3a and 3b, regions (third and fourth same-active-region regions) A3a and A3b are defined, respectively. The region A3a or A3b has an active region pattern including the active region 21a or 21b and its surrounding active regions 12 which are separated from the active region 21a or 21b by an isolation region. The active region patterns in the regions A3a and A3b are the same. The regions A3a and A3b extend over a distance AL3 in the channel length direction and a distance AW3 in the channel width direction, from the channel regions of the transistors 3a and 3b. The shapes and positions of active regions other than the regions A3a and A3b may not necessarily be the same.

As shown in FIG. 5A, the regions A3a and A3b have a width in the channel width direction which is narrower than that of the regions A1a and A1b. That is, OW1<OW2 and AW1>AW3.

Figure 6:
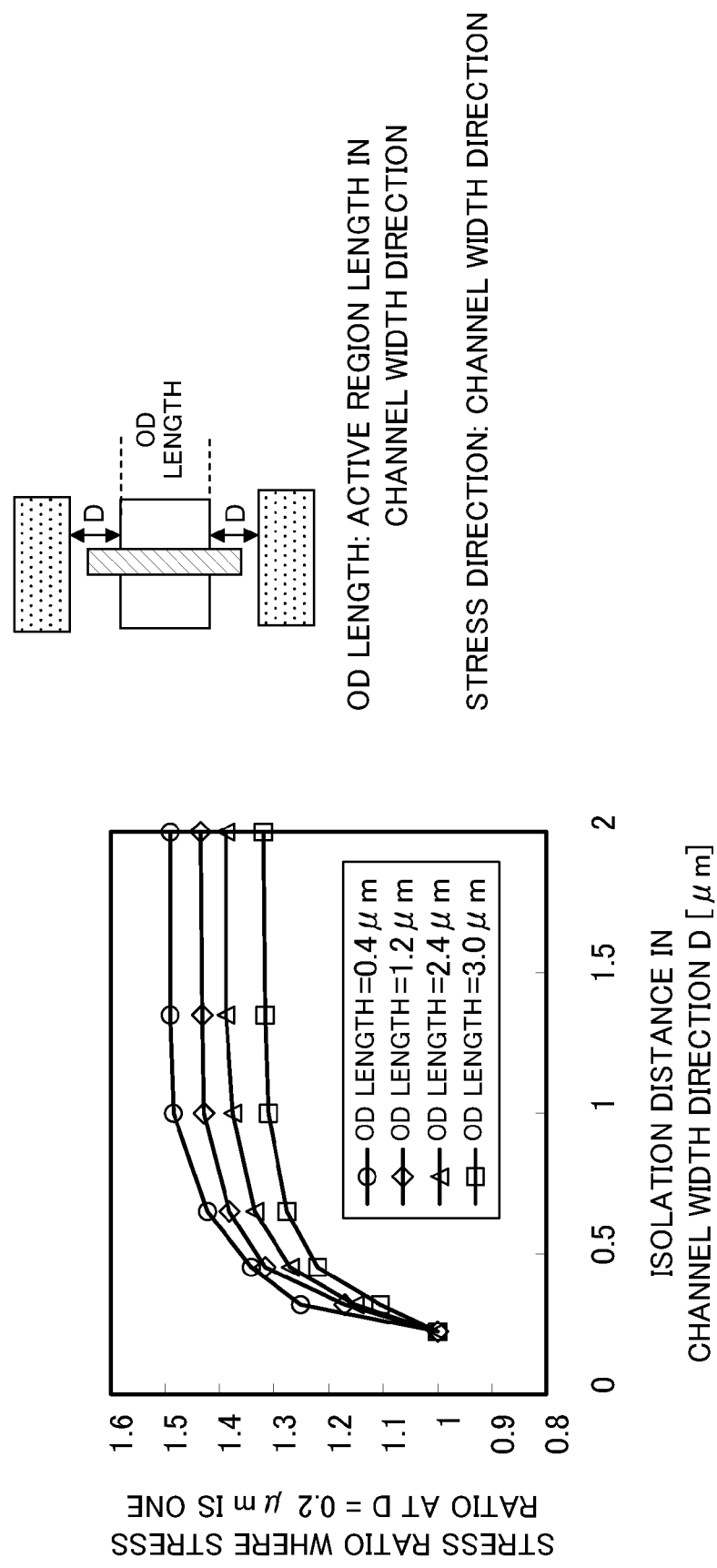
FIG. 6 is a diagram showing the result of a process simulation for demonstrating advantages of the semiconductor device of the second embodiment.

FIG. 6 shows the result of a process simulation of mechanical stress in the channel width direction which occurs in the channel region of a transistor. The stress was analyzed using an analysis technique similar to that of FIG. 2. Average stress values of the channel region interface were calculated and plotted, where the channel length of the transistor was 0.4 µm, and the length in the channel width direction of the active region was 0.4 µm, 1.2 µm, 2.4 µm, or 3 µm. The horizontal axis indicates isolation distances D [µm] in the channel width direction, and the vertical axis indicates stress ratios where stress at D=0.2 µm is one.

As can be seen from FIG. 6, the stress applied to the channel region in the channel width direction increases with an increase in the isolation distance D in the channel width direction, and is saturated when the distance D exceeds a predetermined level. Therefore, it is considered that the influence on the stress in the channel width direction of the shape or position of an active region provided in a region located at a predetermined distance or more from the channel region, is also substantially negligible as in the case of the stress in the channel length direction shown in FIG. 2.

As can also be seen from FIG. 6, as the length in the channel width direction of the active region increases in a transistor, the isolation distance in the channel width direction of the transistor beyond which stress applied on the channel region is saturated decreases. In other words, as the length in the channel width direction of the active region increases in a transistor, the width in the channel width direction of the same-active-region region can be further narrowed.

As described above, in the semiconductor device of this embodiment, as shown in FIG. 5A, the active region length OW2 in the channel width direction of the transistors 3a and 3b is longer than the active region length OW1 in the channel width direction of the transistors 1a and 1b. Therefore, the same-active-region regions A3a and A3b of the transistors 3a and 3b have a narrower width in the channel width direction than that of the same-active-region regions A1a and A1b of the transistors 1a and 1b. As a result, the same-active-region regions A3a and A3b are narrower than the same-active-region regions A1a and A1b, and therefore, the range within which the layout pattern is limited becomes narrower, whereby the flexibility of arrangement of active regions can be increased proportionately, resulting in an increase in the flexibility of design.

Figure 7:
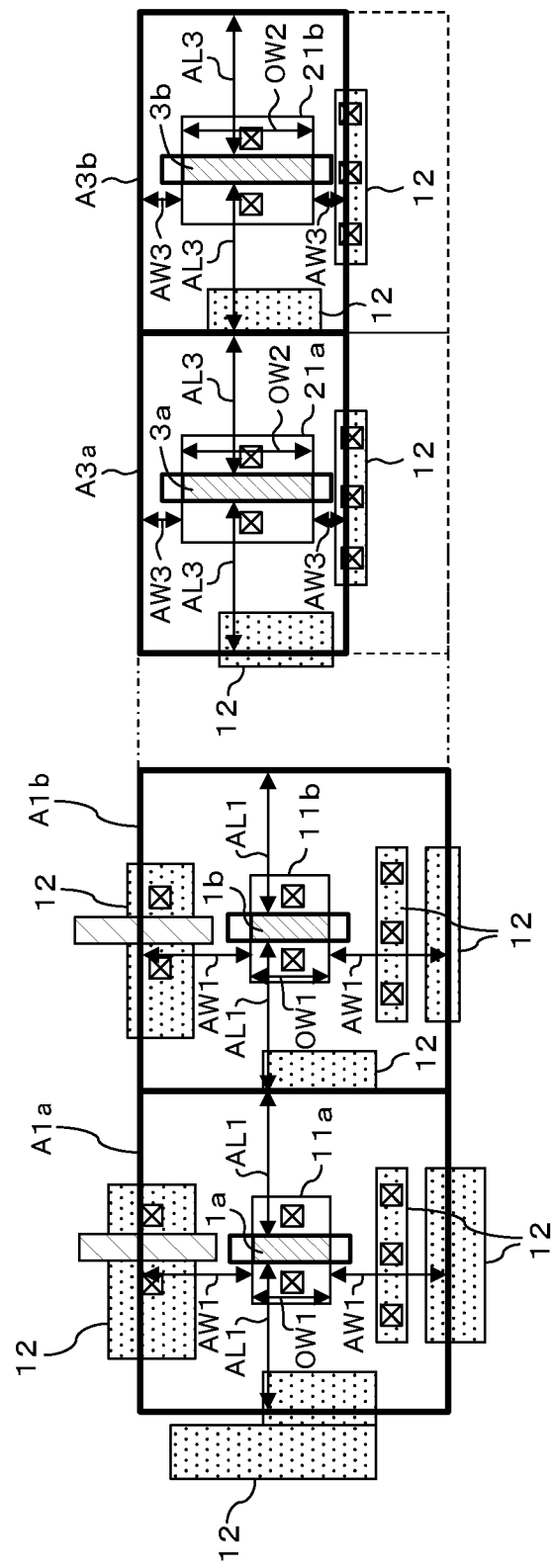
FIG. 7 is a plan view showing another example structure of the semiconductor device of the second embodiment.

FIG. 7 is a plan view showing another example structure of the semiconductor device of this embodiment. In the structure of FIG. 7, the upper sides of the same-active-region regions A3a and A3b of the transistors 3a and 3b and the upper sides of the same-active-region regions A1a and A1b of the transistors 1a and 1b are arranged in a line. As a result, the range within the layout pattern is limited becomes narrower and more compact, whereby the circuit area can be further reduced.

Figure 8:
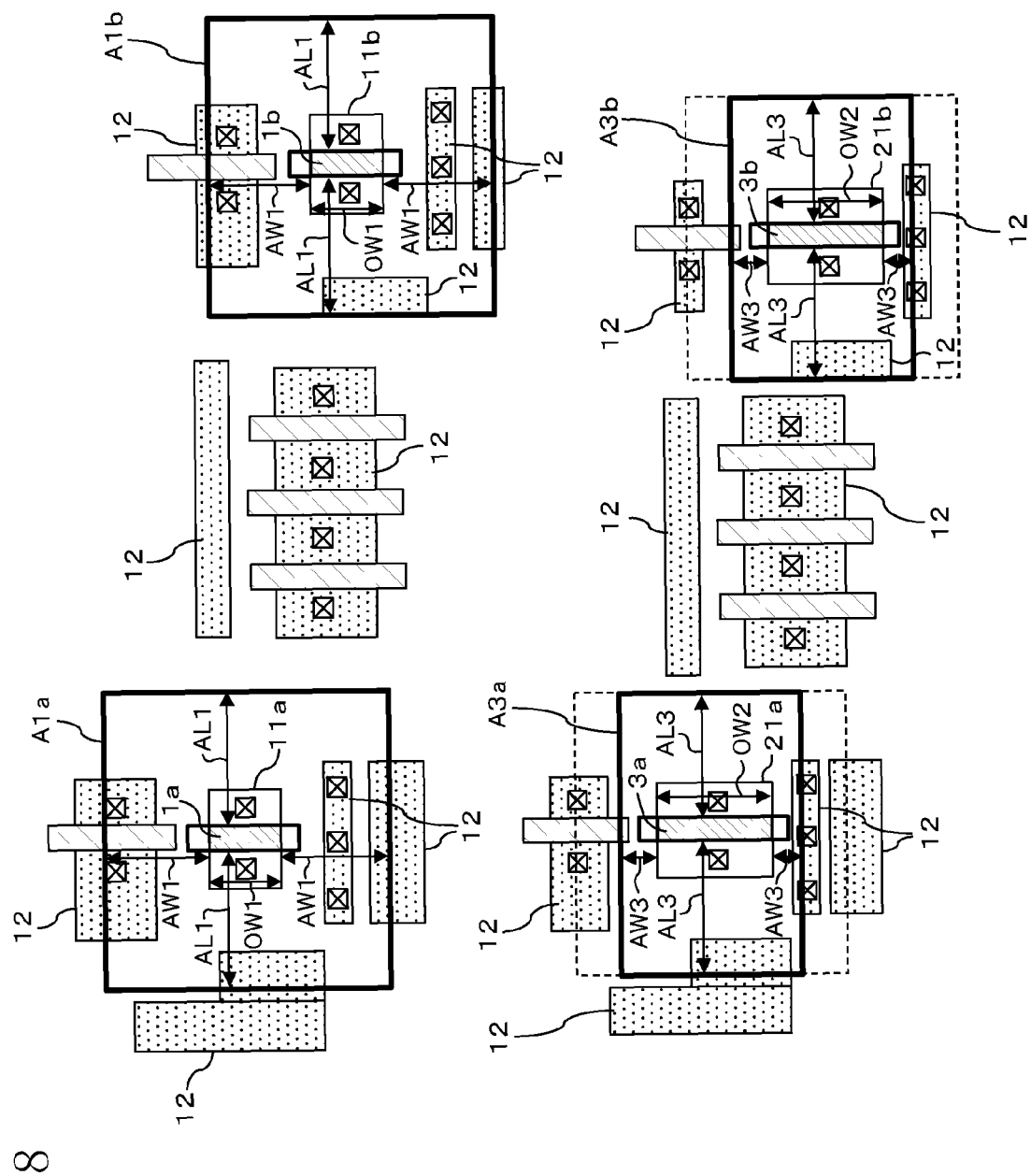
FIG. 8 is a plan view showing still another example structure of the semiconductor device of the second embodiment.

FIG. 8 is a plan view showing still another example structure of the semiconductor device of this embodiment. In the structure of FIG. 5, the transistors 1a and 1b are adjacent to each other, and the transistors 3a and 3b are also adjacent to each other. Note that paired transistors may not necessarily be adjacent to each other. Specifically, in the structure of FIG. 8, the transistors 1a and 1b are separated or arranged at a distance from each other, and the transistors 3a and 3b are also separated or arranged at a distance from each other.

Note that, as in the first embodiment, the surrounding active regions 12 in each of the same-active-region regions A1a, A1b, A3a, and A3b may be active regions which are electrically connected, i.e., active elements, or alternatively, may be dummy active regions which are not electrically connected, i.e., dummy elements. Because any one of a dummy active region and an active region can be selected, the imbalance in transistor characteristics can be reduced or prevented while the flexibility of design can be improved.

Third Embodiment

In the first and second embodiments, an example has been described in which two pairs of transistors have regions having the same active region pattern. In a third embodiment, an example will be described in which two pairs of transistors have regions having the same gate electrode pattern.

Figure 9B:
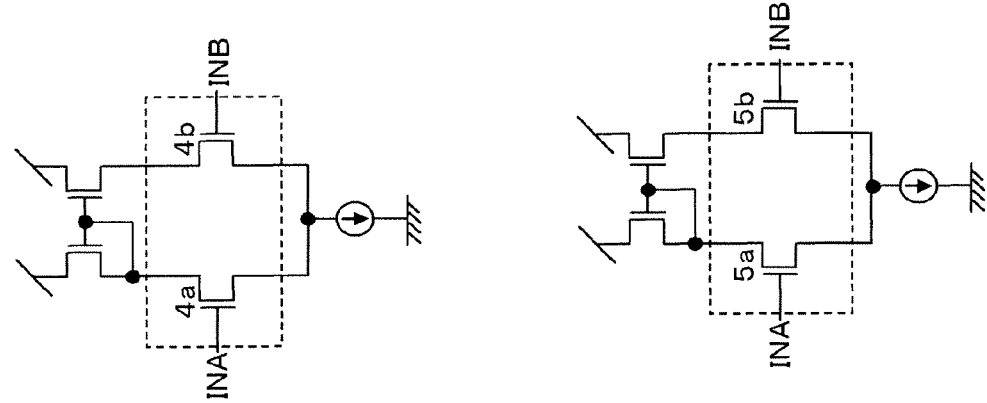
FIG. 9B is a circuit diagram showing a differential circuit including transistors shown in FIG. 9A.
Figure 9A:
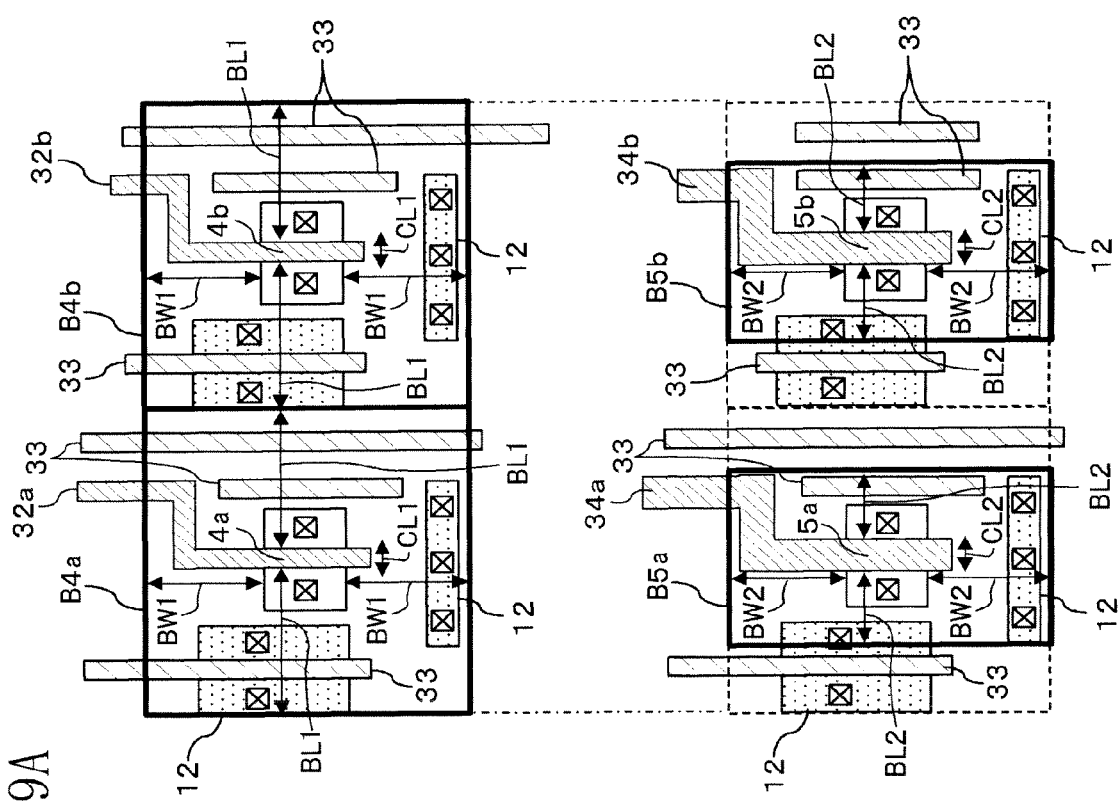
FIG. 9A is a plan view showing an example structure of a semiconductor device according to a third embodiment of the present disclosure.

FIG. 9A is a plan view showing an example structure of a semiconductor device according to the third embodiment of the present disclosure. As shown in FIG. 9A, the semiconductor device of this embodiment includes transistors (first and second transistors) 4a and 4b having the same channel length (CL1) and channel width, and transistors (third and fourth transistors) 5a and 5b having the same channel length (CL2) and channel width. Note that, as shown in a circuit diagram of FIG. 9B, the pairs of the transistors 4a and 4b and the transistors 5a and 5b are each used to form a differential circuit etc.

In each transistor, a region where the active region and the gate electrode overlap is a channel region. The channel length CL2 of the transistors 5a and 5b is longer than the channel length CL1 of the transistors 4a and 4b.

For the transistors 4a and 4b, regions (first and second same-gate-electrode regions) B4a and B4b are defined, respectively. The region B4a or B4b has a gate electrode pattern including the gate electrode 32a or 32b of the transistor and its surrounding gate electrodes 33. The gate electrode patterns in the regions B4a and B4b are the same. Note that the gate electrode pattern refers to a layout pattern of a gate electrode and its surrounding gate electrodes, and that the gate electrode patterns are the same means that, in the corresponding regions, the corresponding gate electrodes have the same shape and are located at the same corresponding positions, and the corresponding surrounding gate electrodes have the same shape and are located at the same corresponding positions. The regions B4a and B4b extend over a distance BL1 in the channel length direction and a distance BW1 in the channel width direction, from the channel regions of the transistors 4a and 4b. The shapes and positions of gate electrodes in regions other than the regions B4a and B4b may not necessarily be the same.

For the transistors 5a and 5b, regions (third and fourth same-gate-electrode regions) B5a and B5b are defined, respectively. The region B5a or B5b has a gate electrode pattern including the gate electrode 34a or 34b of the transistor and its surrounding active regions 33. The gate electrode patterns in the regions B5a and B5b are the same. The regions B5a and B5b extend over a distance BL2 in the channel length direction and a distance BW2 in the channel width direction, from the channel regions of the transistors 5a and 5b. The shapes and positions of gate electrodes in regions other than the regions B5a and B5b may not necessarily be the same.

As shown in FIG. 9A, the regions B5a and B5b have a width in the channel length direction which is narrower than that of the regions B4a and B4b. That is, CL1<CL2 and BL1>BL2.

Figure 10:
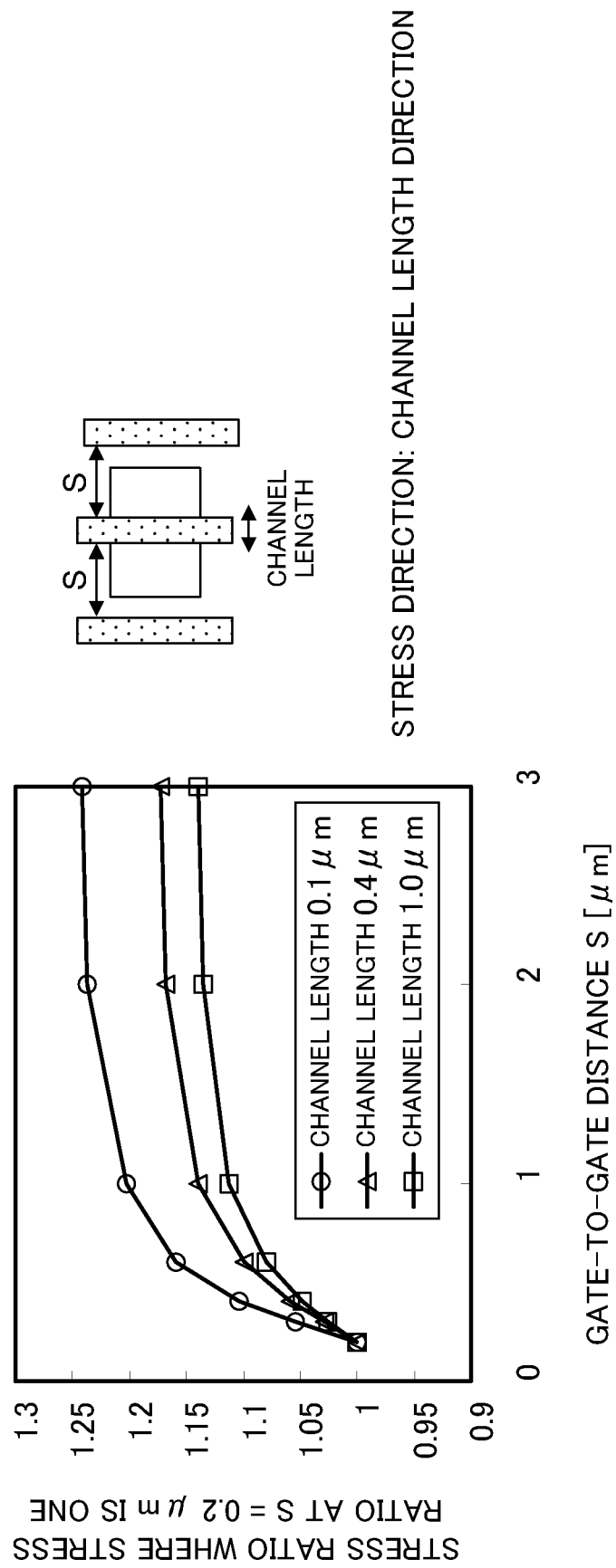
FIG. 10 is a diagram showing the result of a process simulation for demonstrating advantages of the semiconductor device of the third embodiment.

FIG. 10 shows the result of a process simulation of mechanical stress in the channel length direction which occurs in the channel region of a transistor. Average stress values of the channel region interface were calculated and plotted, where the channel length of the transistor was 0.1 μm, 0.4 μm, or 1.0 μm. The horizontal axis indicates gate-to-gate distances S [μm] in the channel length direction, and the vertical axis indicates stress ratios where stress at S=0.2 μm is one. FIG. 10 shows the dependency of the mechanical stress occurring in the channel region on the position of a surrounding gate electrode.

As can be seen from FIG. 10, the stress applied to the channel region in the channel length direction increases with an increase in the gate-to-gate distance S in the channel length direction, and is saturated when the distance S exceeds a predetermined level. Therefore, it is considered that the influence on the stress of the shape or position of a gate electrode provided in a region located at a predetermined distance or more from the channel region in the channel length direction, is substantially negligible.

Therefore, the distance from the channel region beyond which the transistor characteristics or the stress value is saturated is obtained based on the result of actual measurement of the dependency of the transistor characteristics on the shape of a surrounding gate electrode, the result of stress analysis of a process simulation, etc., and is used to define the above same-gate-electrode region. Thereafter, for two pairs of transistors, the shapes and positions of the corresponding gate electrodes are caused to be the same in the same-gate-electrode regions. As a result, the imbalance in transistor characteristics caused by the gate electrode patterns can be reduced or prevented. Since all corresponding gate electrodes in the same-gate-electrode regions have the same shapes and positions, not only the influence of near surrounding gate electrodes, but also the influence of farther surrounding gate electrodes separated from the transistors of interest, can be reduced or prevented.

As can also be seen from FIG. 10, as the channel length increases in a transistor, the gate-to-gate distance beyond which stress applied on the channel region is saturated decreases. Therefore, paired transistors having a longer channel length may have a narrower width in the channel length direction of the same-gate-electrode regions. In other words, the imbalance in transistor characteristics of paired transistors having a longer channel length can be reduced or prevented by using narrower same-gate-electrode regions.

As described above, in the semiconductor device of this embodiment, as shown in FIG. 9A, the channel length CL2 of the transistors 5a and 5b is longer than the channel length CL1 of the transistors 4a and 4b. Therefore, the same-gate-electrode regions B5a and B5b of the transistors 5a and 5b have a narrower width in the channel length direction than that of the same-gate-electrode regions B4a and B4b of the transistors 4a and 4b. As a result, the same-gate-electrode regions B5a and B5b are narrower than the same-gate-electrode regions B4a and B4b, and therefore, the range within which the layout pattern is limited is reduced, whereby the flexibility of arrangement of gate electrodes can be increased proportionately, resulting in an increase in the flexibility of design.

Figure 11:
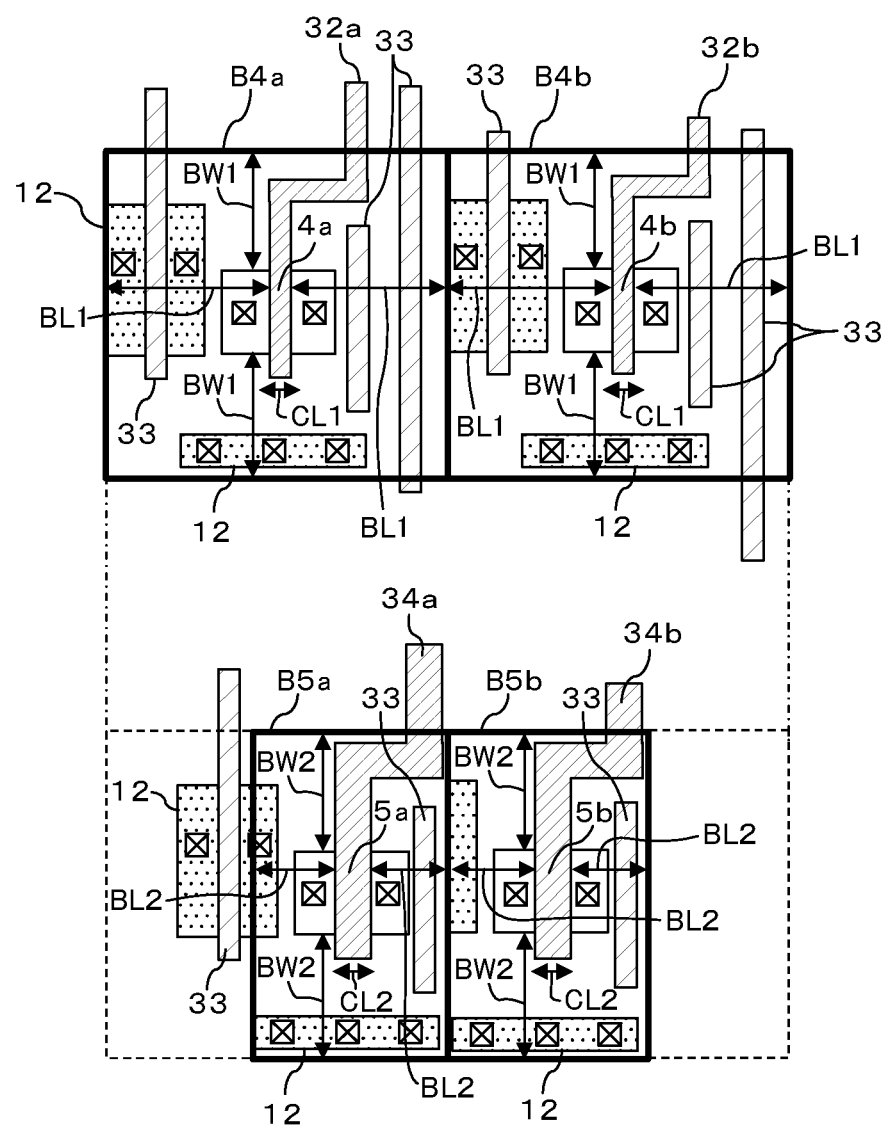
FIG. 11 is a plan view showing another example structure of the semiconductor device of the third embodiment.

FIG. 11 is a plan view showing another example structure of the semiconductor device of this embodiment. In the structure of FIG. 11, the same-gate-electrode regions B5a and B5b of the transistors 5a and 5b are adjacent to and touch each other. As a result, the range within the layout pattern is limited becomes narrower and more compact, whereby the circuit area can be further reduced.

Figure 12:
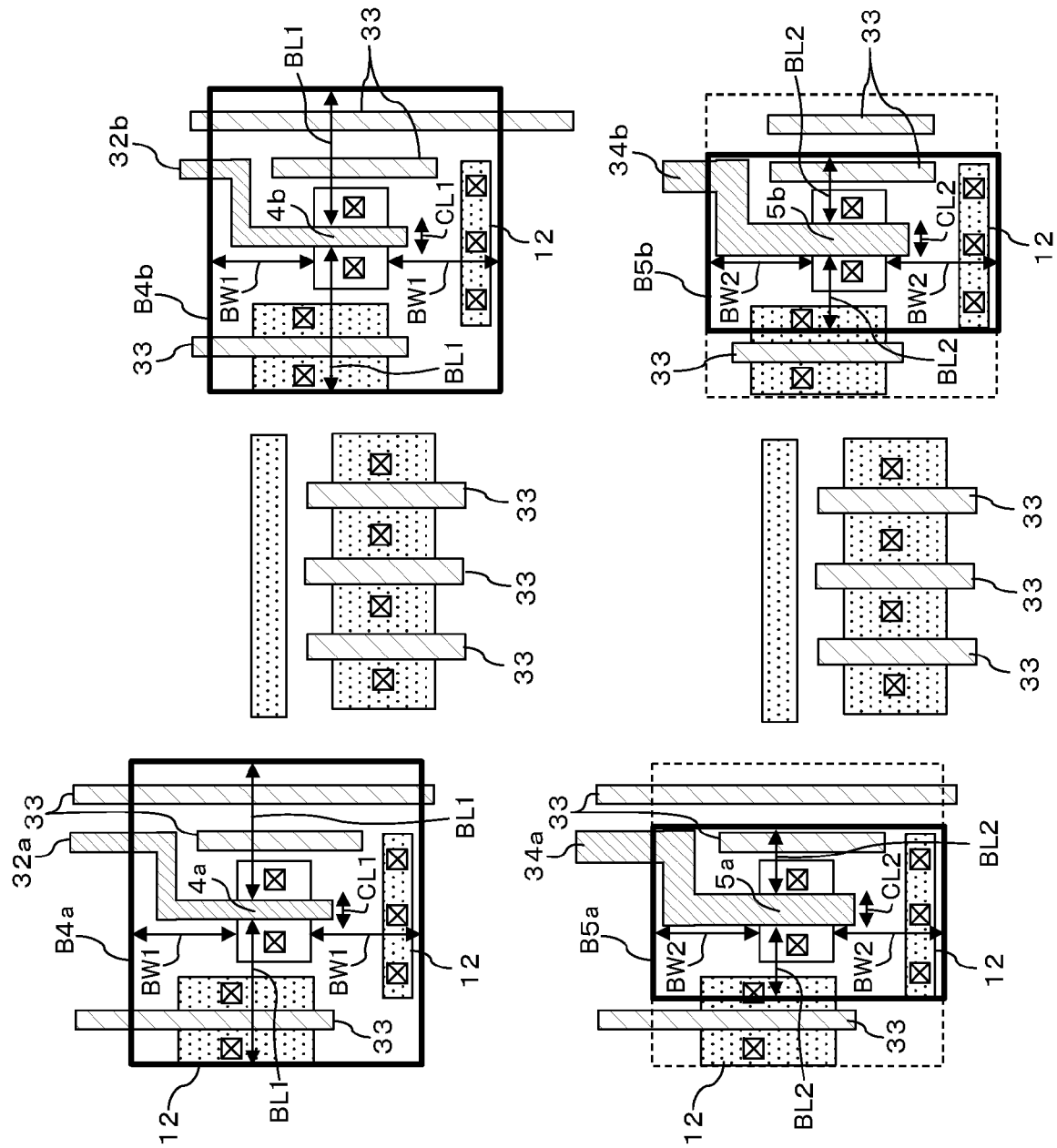
FIG. 12 is a plan view showing still another example structure of the semiconductor device of the third embodiment.

FIG. 12 is a plan view showing still another example structure of the semiconductor device of this embodiment. In the structure of FIG. 9, the transistors 4a and 4b are adjacent to each other, and the transistors 5a and 5b are also adjacent to each other. Note that paired transistors may not necessarily be adjacent to each other. Specifically, in the structure of FIG. 12, the transistors 4a and 4b are separated or arranged at a distance from each other, and the transistors 5a and 5b are also separated or arranged at a distance from each other.

Note that the surrounding gate electrodes 33 in each of the same-gate-electrode regions B4a, B4b, B5a, and B5b may be active gate electrodes which are electrically connected, or alternatively, may be dummy gate electrodes which are not electrically connected. Because any one of a dummy gate electrode and an active gate electrode can be selected, the imbalance in transistor characteristics can be reduced or prevented while the flexibility of design can be improved.

Fourth Embodiment

In a fourth embodiment, an example will be described in which paired transistors have same-active-region regions described in the first and second embodiments and same-gate-electrode regions described in the third embodiment.

Figure 13:
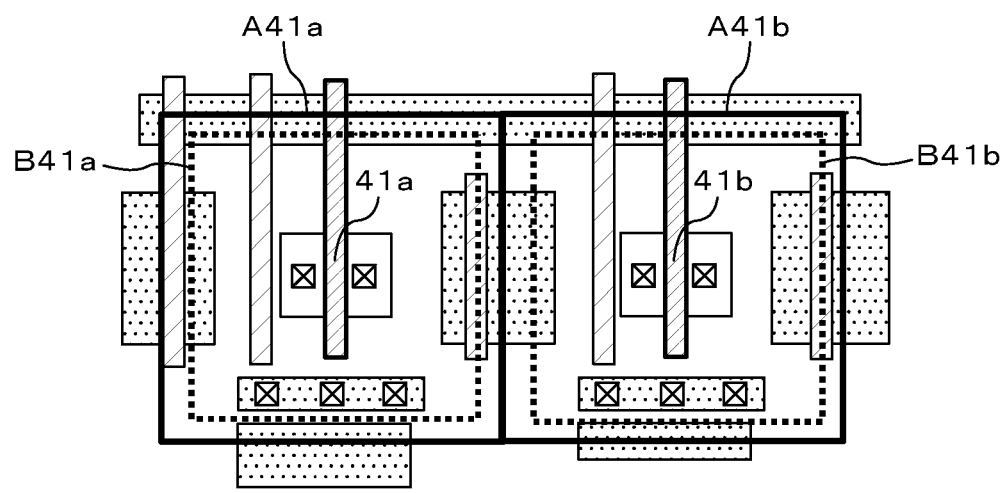
FIG. 13 is a plan view showing an example structure of a semiconductor device according to a fourth embodiment of the present disclosure.
Figure 13:
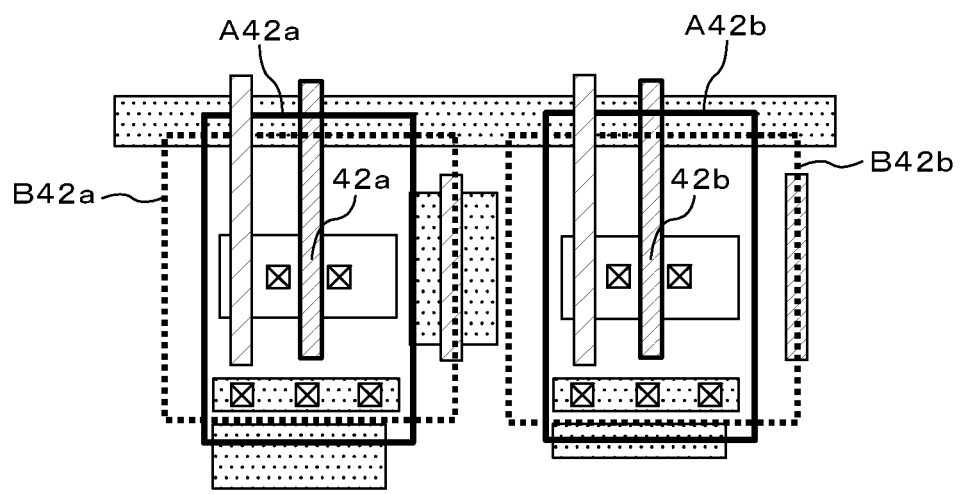

FIG. 13 is a plan view showing an example structure of a semiconductor device according to the fourth embodiment of the present disclosure. As shown in FIG. 13, the semiconductor device of this embodiment includes transistors (first and second transistors) 41a and 41b having the same channel length and channel width, and transistors (third and fourth transistors) 42a and 42b having the same channel length and channel width. The transistors 42a and 42b have the same channel length as that of the transistors 41a and 41b, and a longer length in the channel length direction of the active region than that of the transistors 41a and 41b.

The transistors 41a and 41b have regions (first and second same-active-region regions) A41a and A41b having the same active region pattern. The transistors 42a and 42b have regions (third and fourth same-active-region regions) A42a and A42b having the same active region pattern. Because the length in the channel length direction of the active regions of the transistors 42a and 42b is longer than that of the transistors 41a and 41b, the regions A42a and A42b have a narrower width in the channel length direction than that of the regions A41a and A41b, which is similar to the first embodiment.

The transistors 41a and 41b have regions (first and second same-gate-electrode regions) B41a and B41b having the same gate electrode pattern. The transistors 42a and 42b have regions (third and fourth same-gate-electrode regions) B42a and B42b having the same gate electrode pattern. Because the channel length of the transistors 42a and 42b is the same as that of the transistors 41a and 41b, the regions B42a and B42b have the same width in the channel length direction as that of the regions B41a and B41b.

In the structure of FIG. 13, the same-active-region regions A41a and A41b and the same-gate-electrode regions B41a and B41b have different sizes, and the same-active-region regions A42a and A42b and the same-gate-electrode regions B42a and B42b have different sizes.

According to this embodiment, by setting the same-active-region regions A41a, A41b, A42a, and A42b and the same-gate-electrode regions B41a, B41b, B42a, and B42b independently and separately, the flexibility of the layout can be improved. For example, in the case of a layout in which the active region shape has a smaller influence on the imbalance in transistor characteristics than that of the gate electrode shape, as shown in FIG. 13 the same-active-region regions A42a and A42b may be set to be narrower in the channel length direction than the same-gate-electrode regions B42a and B42b. Therefore, the range within which the layout pattern of active regions is limited is reduced, and the range within the layout pattern of gate electrodes is limited by the active region shape is reduced, whereby the layout can be more flexibly decided.

Figure 14:
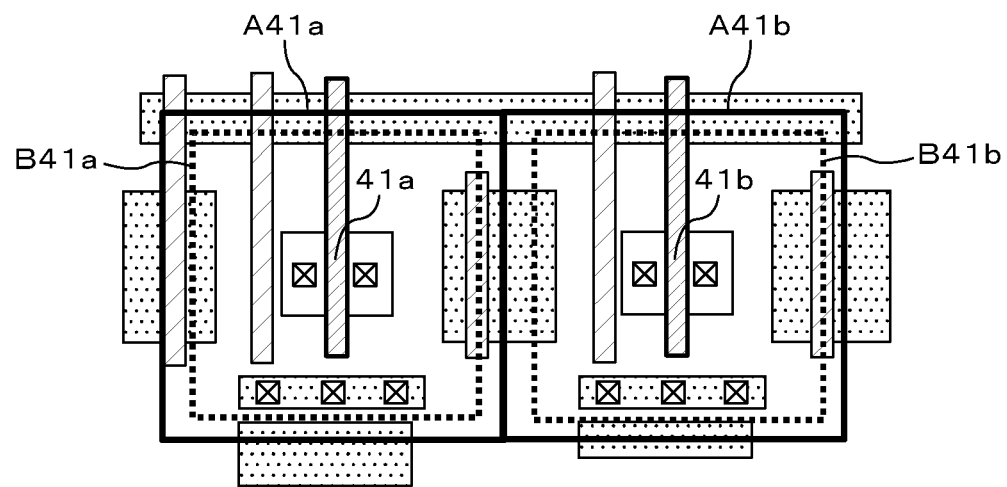
FIG. 14 is a plan view showing another example structure of the semiconductor device of the fourth embodiment.
Figure 14:
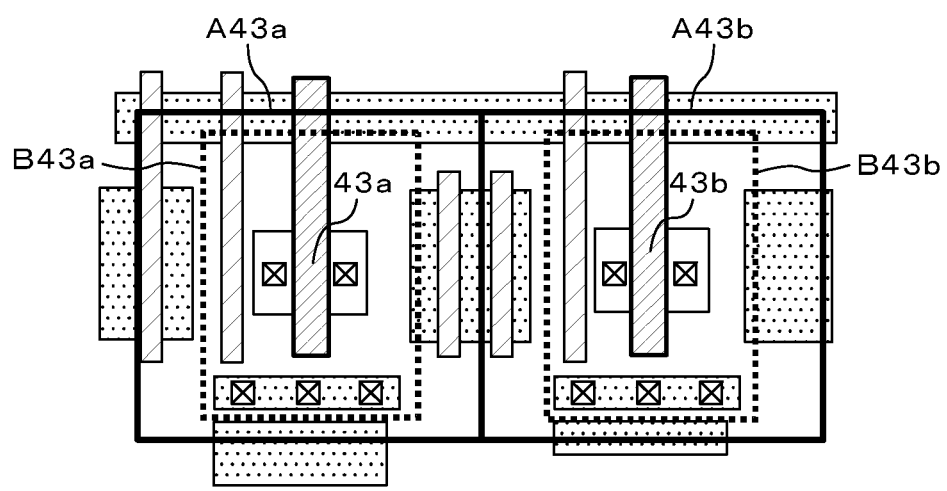

FIG. 14 is a plan view showing another example structure of the semiconductor device of this embodiment. The structure of FIG. 14 includes, instead of the transistors 42a and 42b of FIG. 13, transistors 43a and 43b which have a longer channel length than that of the transistors 41a and 41b and the same length in the channel length direction of the active region as that of the transistors 41a and 41b.

The transistors 43a and 43b have regions (third and fourth same-active-region regions) A43a and A43b having the same active region pattern. The transistors 43a and 43b have the same length in the channel length direction of the active region as that of the transistors 41a and 41b, and therefore, the regions A43a and A43b have the same width in the channel length direction as that of the regions A41a and A41b.

The transistors 43a and 43b have regions (third and fourth same-gate-electrode regions) B43a and B43b having the same gate electrode pattern. The transistors 43a and 43b have a longer channel than that of the transistors 41a and 41b, and therefore, the regions B43a and B43b have a narrower width in the channel length direction than that of the regions B41a and B41b, which is similar to the third embodiment.

In the structure of FIG. 14, the same-active-region regions A41a and A41b and the same-gate-electrode regions B41a and B41b have different sizes, and the same-active-region regions A43a and A43b and the same-gate-electrode regions B43a and B43b have different sizes.

In the case of a layout in which the gate electrode shape has a smaller influence on the imbalance in transistor characteristics than that of the active region shape, as shown in FIG. 14 the same-gate-electrode regions B43a and B43b may be set to be narrower in the channel length direction than the same-active-region regions A43a and A43b. Therefore, the range within which the layout pattern of gate electrodes is limited is reduced, and the range within the layout pattern of active regions is limited by the gate electrode shape is reduced, whereby the layout can be more flexibly decided.

Although an example has been described in which this embodiment is combined with the first or third embodiment, this embodiment may be combined with the second embodiment. For example, in the structure of FIG. 13, when the length in the channel width direction of the active regions of the transistors 42a and 42b is longer than that of the transistors 41a and 41b, the width in the channel width direction of the regions A42a and A42b may be narrower than that of the regions A41a and A41b. Of course, this embodiment may be combined with any two or more of the first to third embodiments.

<Regarding Same Active Region Patterns and Gate Electrode Patterns>

As used herein, that active region patterns or gate electrode patterns are the same means that the patterns have the same size or shape. Patterns having the same size or shape are assumed to be the same even when one of the patterns may be rotated or reversed with respect to the other or when the patterns are axisymmetric or point-symmetric, for example. As a result, the flexibility of layout is improved.

Figure 15:
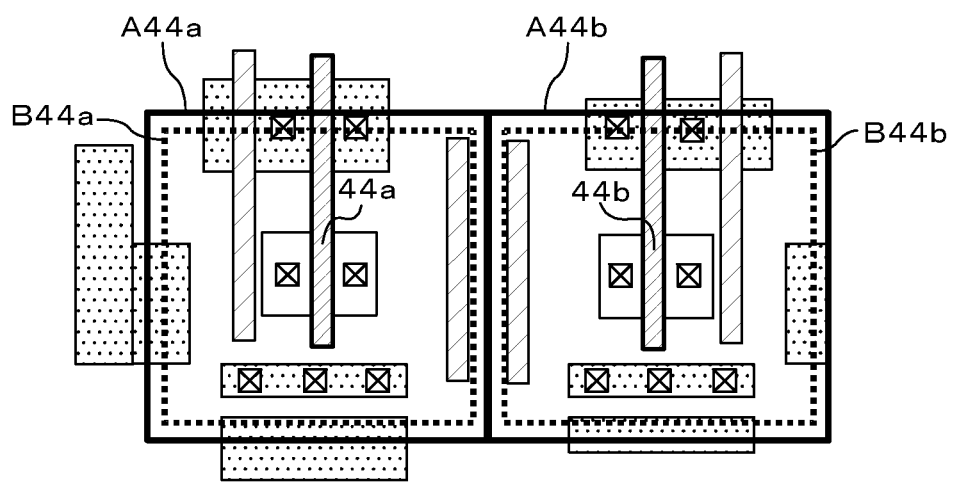
FIG. 15 is a plan view showing an example structure of a semiconductor device according to a variation.
Figure 15:
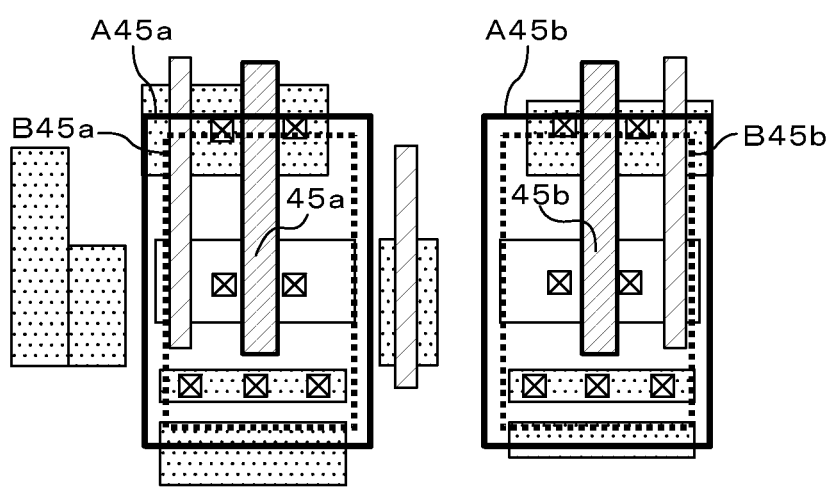

FIG. 15 is a plan view showing an example structure of a semiconductor device according to a variation. In the variation of FIG. 15, active region patterns are axisymmetric and gate electrode patterns are axisymmetric. As shown in FIG. 15, the semiconductor device of this variation includes transistors 44a and 44b having the same channel length and channel width, and transistors 45a and 45b having the same channel length and channel width. The channel length, and the active region length in the channel length direction, of the transistors 45a and 45b are longer than those of the transistors 44a and 44b.

The transistors 44a and 44b include same-active-region regions A44a and A44b and same-gate-electrode regions B44a and B44b. Here, in the same-active-region regions A44a and A44b, the active region patterns (i.e., the shapes and positions of the active regions and their surrounding active regions) are axisymmetric. Similarly, in the same-gate-electrode regions B44a and B44b, the gate electrode patterns (i.e., the shapes and positions of the gate electrodes and their surrounding gate electrodes) are axisymmetric.

The transistors 45a and 45b have same-active-region regions A45a and A45b and same-gate-electrode regions B45a and B45b. Here, in the same-active-region regions A45a and A45b, the active region patterns are axisymmetric. Similarly, in the same-gate-electrode regions B45a and B45b, the gate electrode patterns are axisymmetric. The same-active-region regions A45a and A45b have a narrower width in the channel length direction than that of the same-active-region regions A44a and A44b. The same-gate-electrode regions B45a and B45b have a narrower width in the channel length direction than that of the same-gate-electrode regions B44a and B44b.

Figure 16:
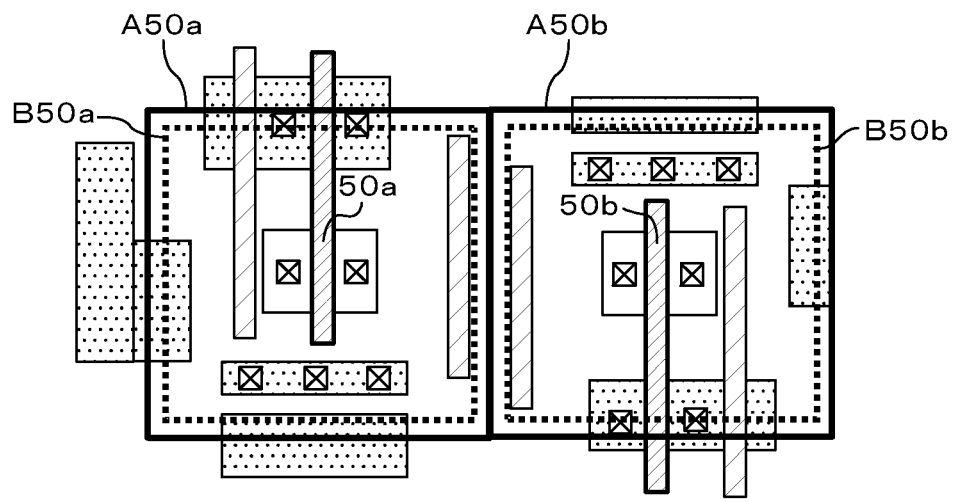
FIG. 16 is a plan view showing an example structure of a semiconductor device according to another variation.
Figure 16:
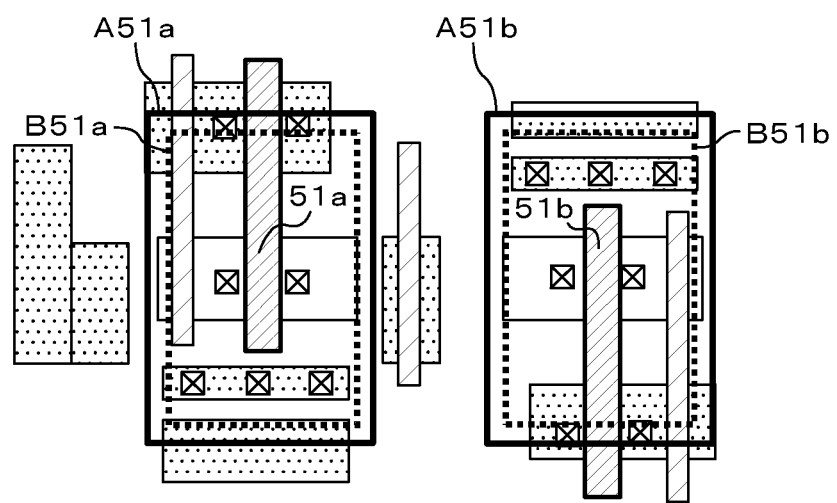

FIG. 16 is a plan view showing an example structure of a semiconductor device according to another variation. In the variation of FIG. 16, active region patterns are point-symmetric and gate electrode patterns are point-symmetric. As shown in FIG. 16, the semiconductor device of this variation includes transistors 50a and 50b having the same channel length and channel width, and transistors 51a and 51b having the same channel length and channel width. The channel length, and the active region length in the channel length direction, of the transistors 51a and 51b are longer than those of the transistors 50a and 50b.

The transistors 50a and 50b include same-active-region regions A50a and A50b and same-gate-electrode regions B50a and B50b. Here, in the same-active-region regions A50a and A50b, the active region patterns are point-symmetric. Similarly, in the same-gate-electrode regions B50a and B50b, the gate electrode patterns are point-symmetric.

The transistors 51a and 51b have same-active-region regions A51a and A51b and same-gate-electrode regions B51a and B51b. Here, in the same-active-region regions A51a and A51b, the active region patterns are point-symmetric. Similarly, in the same-gate-electrode regions B51a and B51b, the gate electrode patterns are point-symmetric. The same-active-region regions A51a and A51b have a narrower width in the channel length direction than that of the same-active-region regions A50a and A50b. The same-gate-electrode regions B51a and B51b have a narrower width in the channel length direction than that of the same-gate-electrode regions B50a and B50b.

Figure 17:
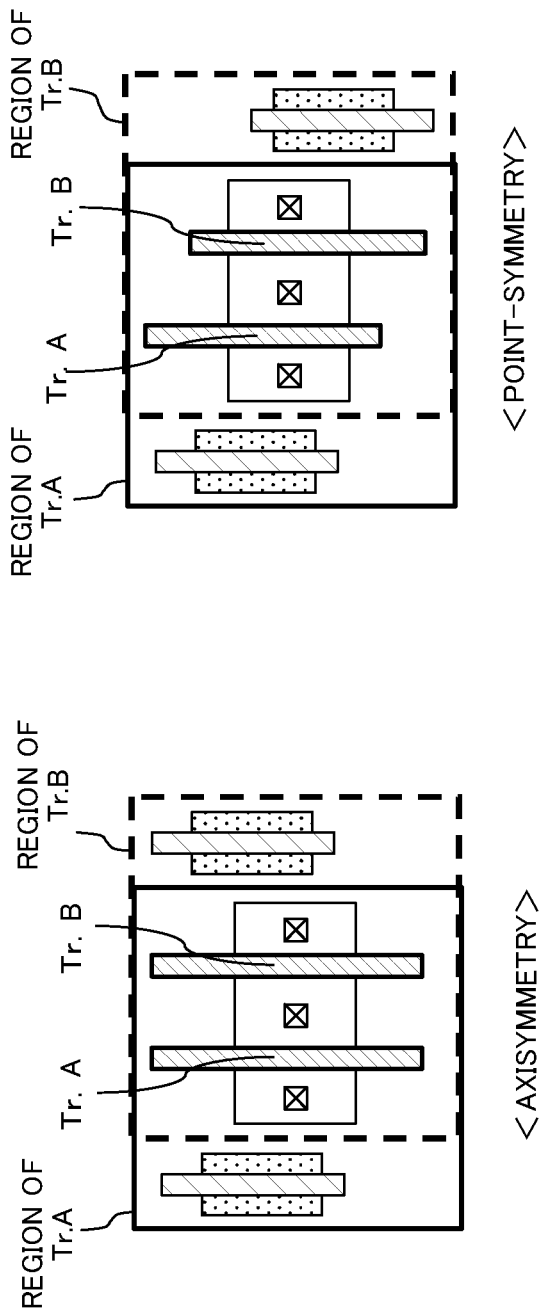
FIG. 17 is a diagram showing a layout according to another variation when paired transistors share an active region.

FIG. 17 shows an example layout according to another variation in which paired transistors shares an active region. In the layout of FIG. 17, for paired transistors Tr.A and Tr.B, active region patterns are axisymmetric or point-symmetric, i.e., are the same, and gate electrode patterns are axisymmetric or point-symmetric, i.e., are the same. Therefore, advantages similar to those of each embodiment are obtained, whereby the imbalance in transistor characteristics caused by a layout pattern of active regions and gate electrodes can be reduced or prevented.

Fifth Embodiment

Figure 18:
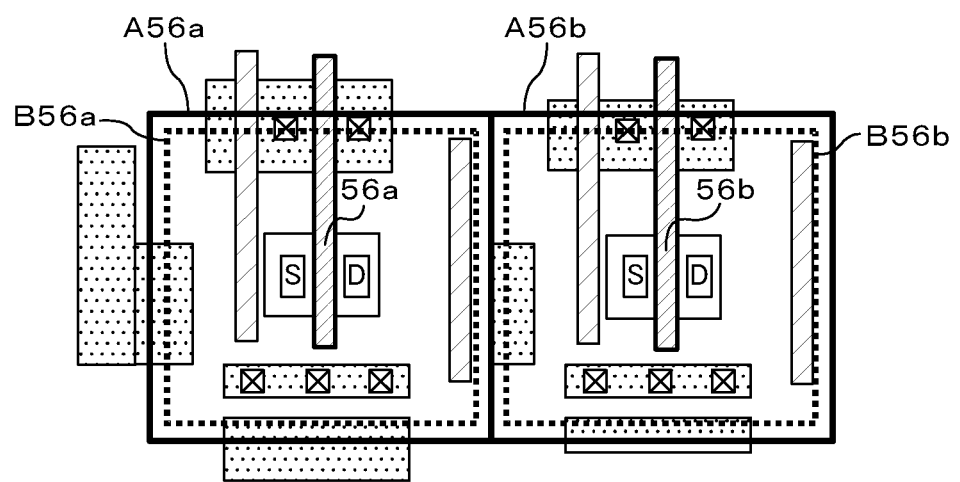
FIG. 18 is a plan view showing an example structure of a semiconductor device according to a fifth embodiment of the present disclosure.
Figure 18:
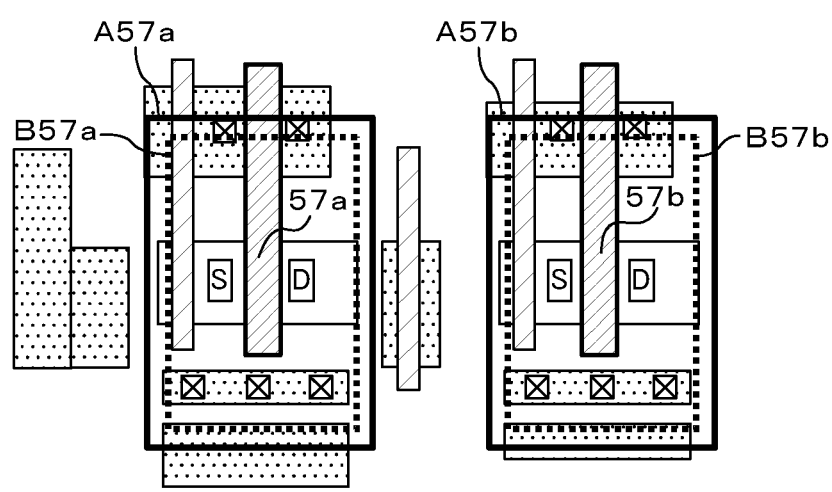

FIG. 18 is a plan view showing an example structure of a semiconductor device according to a fifth embodiment. As shown in FIG. 18, the semiconductor device of this embodiment includes transistors 56a and 56b having the same channel length and channel width, and transistors 57a and 57b having the same channel length and channel width. The channel length, and the active region length in the channel length direction, of the transistors q57a and 57b are longer than those of the transistors 56a and 56b.

The transistors 56a and 56b include same-active-region regions A56a and A56b and same-gate-electrode regions B56a and B56b. The transistors 57a and 57b have same-active-region regions A57a and A57b and same-gate-electrode regions B57a and B57b. The same-active-region regions A57a and A57b have a narrower width in the channel length direction than that of the same-active-region regions A56a and A56b. The same-gate-electrode regions B57a and B57b have a narrower width in the channel length direction than that of the same-gate-electrode regions B56a and B56b.

In the structure of FIG. 18, the transistors 56a and 56b have the same source-to-drain direction, and similarly, the transistors 57a and 57b have the same source-to-drain direction. In other words, the transistors 56a and 56b have the same current direction and the transistors 57a and 57b have the same current direction, as viewed with respect to the semiconductor device. By thus causing paired transistors to have the same source-to-drain direction, the imbalance in transistor characteristics caused by the current directions can be reduced or prevented.

Specifically, in a transistor fabrication process, when an impurity is implanted into a semiconductor substrate using a gate electrode as a mask to form source and drain regions, the angle of the implantation may be large at some positions on a wafer where transistors of interest are located. In this case, the implantation is blocked by the gate electrode, resulting in asymmetric impurity distributions in a source and a drain. Therefore, when paired transistors have different source-to-drain directions, the asymmetric impurity distributions may lead to a significant difference in characteristics, such as a transistor current etc.

With the structure of FIG. 18, paired transistors have the same source-to-drain direction, whereby the imbalance in transistor characteristics caused by the asymmetric impurity distributions can be reduced or prevented while the imbalance in transistor characteristics caused by the layout pattern of active regions or gate electrodes can be reduced or prevented.

Figure 19:
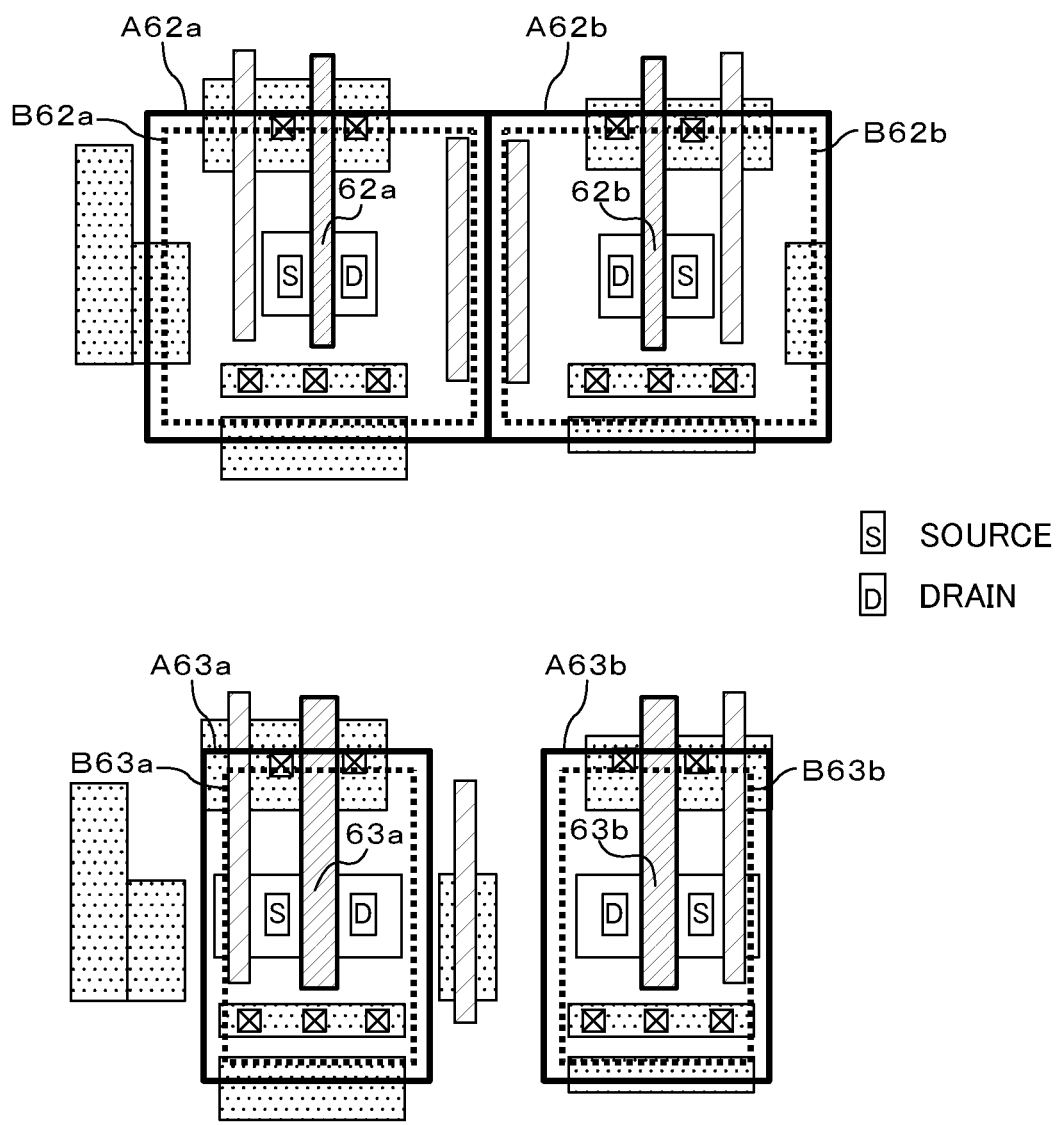
FIG. 19 is a plan view showing another example structure of the semiconductor device of the fifth embodiment.

FIG. 19 is a plan view showing another example structure of the semiconductor device of this embodiment. As shown in FIG. 19, the semiconductor device of this embodiment includes transistors 62a and 62b having the same channel length and channel width, and transistors 63a and 63b having the same channel length and channel width. The channel length, and the active region length in the channel length direction, of the transistors 63a and 63b are longer than those of the transistors 62a and 62b.

The transistors 62a and 62b include same-active-region regions A62a and A62b and same-gate-electrode regions B62a and B62b. The transistors 63a and 63b have same-active-region regions A63a and A63b and same-gate-electrode regions B63a and B63b. The same-active-region regions A63a and A63b have a narrower width in the channel length direction than that of the same-active-region regions A62a and A62b. The same-gate-electrode regions B63a and B63b have a narrower width in the channel length direction than that of the same-gate-electrode regions B62a and B62b.

Here, in the same-active-region regions A62a and A62b, the active region patterns are axisymmetric. In the same-active-region regions A63a and A63b, the active region patterns are axisymmetric.

In the structure of FIG. 19, the paired transistors 62a and 62b have the same source-to-drain direction with respect to the active region patterns in the same-active-region regions A62a and A62b. Specifically, the active region patterns in the same-active-region regions A62a and A62b are axisymmetric, and therefore, the source-to-drain directions of the transistors 62a and 62b are axisymmetric (i.e., opposite) as with the active region patterns. Similarly, because the active region patterns in the same-active-region regions A63a and A63b are axisymmetric, the source-to-drain directions of the transistors 63a and 63b are opposite to each other. In other words, the paired transistors have the same current direction, as viewed with respect to the active region pattern in the same-active-region regions. This also applies to the structure of FIG. 18.

By causing paired transistors to have the same source-to-drain direction with respect to the active region patterns, the imbalance in transistor characteristics caused by asymmetric mechanical stresses can be reduced or prevented.

STI-induced mechanical stress has not only an influence on the electron mobility of the channel, but also an influence on the diffusion of an impurity during a thermal treatment in a transistor fabrication process. Therefore, when the active region pattern of a transistor is asymmetric in the vicinity of the source and the drain, different mechanical stresses are applied to the source and the drain, and therefore, impurity distributions in the channel region in the vicinity of the source and the drain are asymmetric between the source and the drain. Therefore, when paired transistors have different source-to-drain directions, the asymmetric impurity distributions caused by mechanical stresses leads to a significant difference in characteristics, such as a transistor current etc.

With the structure of FIG. 19, paired transistors have the same source-to-drain direction with respect to the active region patterns, whereby the imbalance in transistor characteristics caused by the asymmetric impurity distributions can be reduced or prevented while the imbalance in transistor characteristics caused by the layout pattern of active regions or gate electrodes can be reduced or prevented.

Sixth Embodiment

Figure 20:
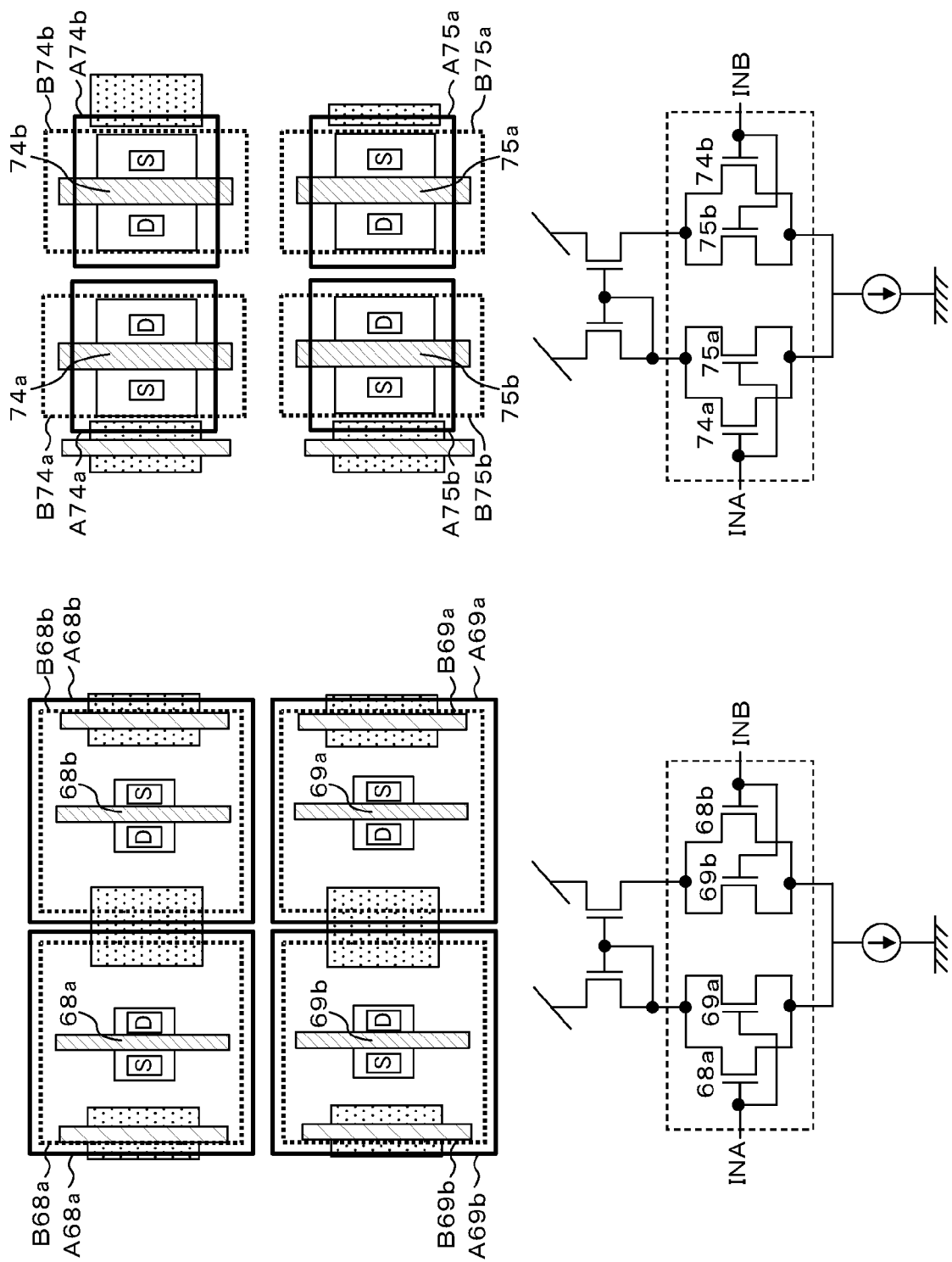
FIG. 20 is a plan view showing an example structure of a semiconductor device according to a sixth embodiment of the present disclosure.
Figure 21:
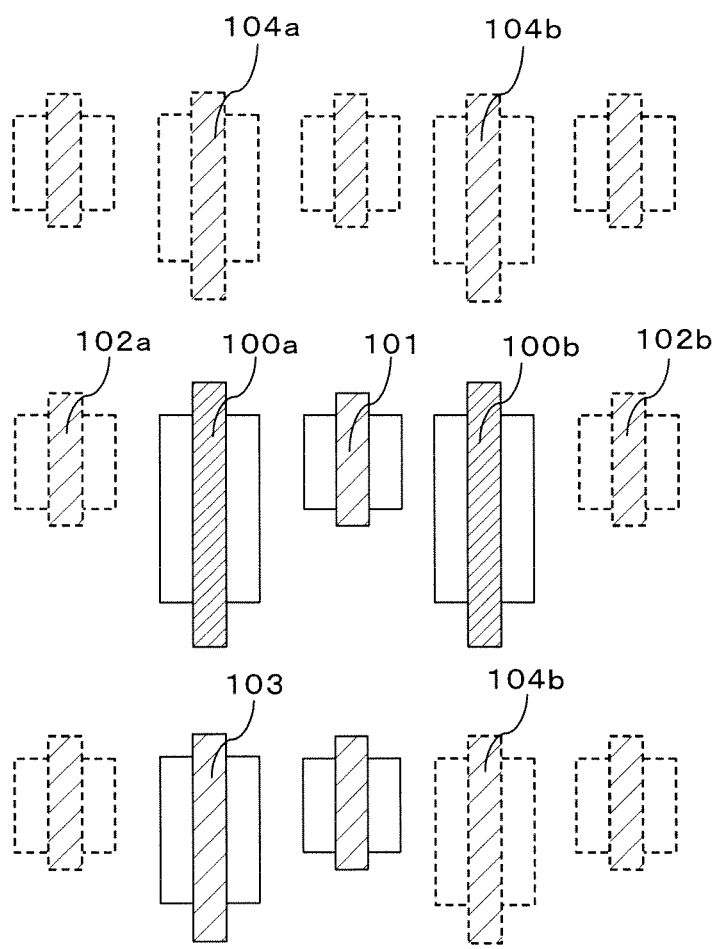
FIG. 21 is a plan view for describing a conventional semiconductor device.

FIG. 20 is a plan view showing an example structure of a semiconductor device according to a sixth embodiment of the present disclosure. FIG. 20 also shows the circuit diagram of a differential circuit employing the transistors shown in the figure. The semiconductor device of FIG. 20 includes transistors (first and second transistors) 68a and 68b having the same channel length and channel width, and transistors (third and fourth transistors) 74a and 74b having the same channel length and channel width. The channel length and the lengths in the channel length and width directions of the active region transistors 74a and 74b are longer than those of the transistors 68a and 68b.

The transistors 68a and 68b have same-active-region regions A68a and A68b and same-gate-electrode regions B68a and B68b. The transistors 74a and 74b have same-active-region regions A74a and A74b and same-gate-electrode regions B74a and B74b. The same-active-region regions A74a and A74b have narrower widths in the channel length and width directions than those of the same-active-region regions A68a and A68b. The same-gate-electrode regions B63a and B63b have a narrower width in the channel length direction than that of the same-gate-electrode regions B62a and B62b.

Here, in the same-active-region regions A68a and A68b, the active region patterns are axisymmetric, and in the same-gate-electrode regions B68a and B68b, the gate electrode patterns are axisymmetric. Similarly, in the same-active-region regions A74a and A74b, the active region patterns are axisymmetric, and in the same-gate-electrode regions B74a and B74b, the gate electrode patterns are axisymmetric. Moreover, the transistors 68a and 68b have opposite source-to-drain directions, and the same current direction, as viewed with respect to the active region patterns of the same-active-region regions A68a and A68b. The transistors 74a and 74b also have opposite source-to-drain directions, and the same current direction, as viewed with respect to the active region patterns of the same-active-region regions A74a and A74b.

With the structure of FIG. 20, as described in the fifth embodiment, paired transistors have the same current directions, as viewed with respect to the active region pattern, whereby the imbalance in transistor characteristics caused by the asymmetric impurity distributions caused by mechanical stresses can be reduced or prevented. Note that because the transistors 68a and 68b have different source-to-drain directions with respect to a wafer, i.e., the semiconductor device, asymmetric impurity distributions caused by implantation may occur.

Therefore, in this embodiment, for the transistors 68a and 68b, paired transistors (fifth and sixth transistors) 69a and 69b having the same active region pattern, gate electrode pattern, and source-to-drain direction are provided and connected together to cancel the mismatch of the current directions. Similarly, for the transistors 74a and 74b, paired transistors 75a and 75b having the same active region pattern, gate electrode pattern, and source-to-drain direction are provided and connected together to cancel the mismatch of the current directions. The transistors 69a and 69b have same-active-region regions A69a and A69b and same-gate-electrode regions B69a and B69b, and the transistors 75a and 75b have same-active-region regions A75a and A75b and same-gate-electrode regions B75a and B75b.

The transistors 69a and 68a have opposite current directions, as viewed with respect to the semiconductor device. As shown in the circuit diagram, the source, drain, and gate of the transistor 69a are connected to the source, drain, and gate of the transistor 68a, respectively. The transistors 69b and 68b have opposite current directions, as viewed with respect to the semiconductor device. The source, drain, and gate of the transistor 69b are connected to the source, drain, and gate of the transistor 68b, respectively. Similarly, the transistors 75a and 74a have opposite current directions, as viewed with respect to the semiconductor device. The source, drain, and gate of the transistor 75a are connected to the source, drain, and gate of the transistor 74a, respectively. The transistors 75b and 74b have opposite current directions, as viewed with respect to the semiconductor device. The source, drain, and gate of the transistor 75b are connected to the source, drain, and gate of the transistor 74b, respectively.

With the structure of FIG. 20, the imbalance in transistor characteristics caused by the asymmetric impurity distributions caused by implantation can be reduced or prevented while the imbalance in transistor characteristics caused by the layout of active regions and gate electrodes and the imbalance in transistor characteristics caused by the asymmetric impurity distributions caused by mechanical stresses are reduced or prevented. Therefore, the region within which the layout pattern is limited can be reduced while these imbalances are reduced or prevented, whereby the flexibility of design can be improved and the increase in circuit area can be reduced or prevented.

According to the present disclosure, the imbalance in characteristics between paired transistors caused by the layout pattern can be reduced or prevented while the increase in circuit area can be reduced or prevented. Therefore, the present disclosure is useful for semiconductor devices including transistors fabricated using an isolation technique, such as STI etc., in which the performance of a semiconductor circuit including a differential circuit is improved while a reduction in yield is reduced or prevented.

What is claimed is:

1. A semiconductor device layout comprising:
   a first transistor formed in a first region;
   a second transistor formed in a second region;
   a third transistor formed in a third region;
   a fourth transistor formed in a fourth region;
   a first active region pattern formed in the first region, the first active region pattern including an active region of the first transistor and at least part of first surrounding diffusion regions;
   a second active region pattern formed in the second region, the second active region pattern including an active region of the second transistor and at least part of second surrounding diffusion regions;
   a third active region pattern formed in the third region, the third active region pattern including an active region of the third transistor and at least part of third surrounding diffusion regions; and
   a fourth active region pattern formed in the fourth region, the fourth active region pattern including an active region of the fourth transistor and at least part of fourth surrounding diffusion regions, wherein:
   the first transistor and the second transistor have a same channel length and a same channel width, the first transistor and the second transistor being paired transistors, of which sources or drains are connected to a common node,
   the third transistor and the fourth transistor have a same channel length and a same channel width, the third transistor and the fourth transistor being paired transistors, of which sources or drains are connected to a common node,
   shapes and sizes of the active region of the first transistor and the at least part of the first surrounding diffusion regions in the first active region pattern are the same as shapes and sizes of the active region of the second transistor and the at least part of the second surrounding diffusion regions in the second active region pattern,
   shapes and sizes of the active region of the third transistor and the at least part of the third surrounding diffusion regions in the third active region pattern are the same as shapes and sizes of the active region of the fourth transistor and the at least part of the fourth surrounding diffusion regions in the fourth active region pattern,
   a width of the active regions of the third and fourth transistors in a channel width direction is larger than a width of the active regions of the first and second transistors in the channel width direction, and
   a length of the third and fourth regions in the channel width direction is shorter than a length of the first and the second regions in the channel width direction.

2. The semiconductor device layout of claim 1, wherein the at least part of the first surrounding diffusion regions in the first region includes a part of a dummy element.

3. The semiconductor device layout of claim 1, wherein the at least part of the first surrounding diffusion regions in the first region includes a part of an active element.

4. The semiconductor device layout of claim 1, wherein the at least part of the second surrounding diffusion regions in the second region includes a part of a dummy element.

5. The semiconductor device layout of claim 1, wherein the at least part of the second surrounding diffusion regions in the second region includes a part of an active element.

6. The semiconductor device layout of claim 1, wherein the at least part of the third surrounding diffusion regions in the third region includes a part of a dummy element.

7. The semiconductor device layout of claim 1, wherein the at least part of the third surrounding diffusion regions in the third region includes a part of an active element.

8. The semiconductor device layout of claim 1, wherein the at least part of the fourth surrounding diffusion regions in the fourth region includes a part of a dummy element.

9. The semiconductor device layout of claim 1, wherein the at least part of the fourth surrounding diffusion regions in the fourth region includes a part of an active element.

10. The semiconductor device layout of claim 1, wherein shapes, sizes and locations of the active region of the first transistor and the at least part of the first surrounding diffusion regions of the first active region pattern in the first region are the same as shapes, sizes and locations of the active region of the second transistor and the at least part of the second surrounding diffusion regions of the second active region pattern in the second region.

11. The semiconductor device layout of claim 1, wherein:
the at least part of the first surrounding diffusion regions includes a part of a dummy diffusion region and a part of an active diffusion region, and
the at least part of the second surrounding diffusion regions includes a part of a dummy diffusion region and a part of an active diffusion region.

* * * * *